(12) United States Patent
Mckay et al.

(10) Patent No.: US 10,924,095 B1
(45) Date of Patent: Feb. 16, 2021

(54) MULTI-RESONANT COUPLING ARCHITECTURES FOR ZZ INTERACTION REDUCTION

(71) Applicant: International Business Machines Corporation, Armonk, NY (US)

(72) Inventors: David C. Mckay, Ossining, NY (US); Abhinav Kandala, Yorktown Heights, NY (US); Srikanth Srinivasan, Mount Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/896,740

(22) Filed: Jun. 9, 2020

(51) Int. Cl.
*H03K 17/92* (2006.01)
*H03K 5/1252* (2006.01)

(52) U.S. Cl.
CPC ........... *H03K 5/1252* (2013.01); *H03K 17/92* (2013.01)

(58) Field of Classification Search
CPC .... H03K 5/1252; H03K 17/92; H03K 19/195; H03K 3/38; G01R 33/035; G01R 33/0352
(Continued)

(56) References Cited

U.S. PATENT DOCUMENTS 9,444,430 B1 * 9/2016 Abdo .................... H01L 39/223
9,501,748 B2 11/2016 Naaman et al.
(Continued)

FOREIGN PATENT DOCUMENTS

CN 110378482 10/2019
WO 2019182729 9/2019

OTHER PUBLICATIONS

Magesan et al., "Effective Hamiltonian models of the cross-resonance gate," arXiv:1804.04073v2 [quant-ph], Feb. 25, 2019, 16 pages.
(Continued)

*Primary Examiner* — Tomi Skibinski
(74) *Attorney, Agent, or Firm* — Amin, Turocy & Watson, LLP

(57) ABSTRACT

Systems and techniques that facilitate multi-resonant couplers for preserving ZX interaction while reducing ZZ interaction are provided. In various embodiments, a first qubit can have a first operational frequency and a second qubit can have a second operational frequency, and a multi-resonant architecture can couple the first qubit to the second qubit. In various embodiments, the multi-resonant architecture can comprise a first resonator and a second resonator. In various cases, the first resonator can capacitively couple the first qubit to the second qubit, and a second resonator can capacitively couple the first qubit to the second qubit. In various aspects, the first resonator and the second resonator can be in parallel. In various instances, the first resonator can have a first resonant frequency less than the first operational frequency and the second operational frequency, and the second resonator can have a second resonant frequency greater than the first operational frequency and the second operational frequency. In various other embodiments, the multi-resonant architecture can comprise a resonator, a first end of which can be capacitively coupled to the first qubit and to the second qubit, and a second end of which can be coupled to ground. In various instances, the resonator can have a first harmonic less than the first operational frequency and the second operational frequency, and can have a second harmonic greater than the first operational frequency and the second operational frequency. In various other embodiments, the multi-resonant architecture can comprise a reso-
(Continued)

nator and a direct coupler. In various embodiments, the resonator and the direct coupler can both capacitively couple the first qubit to the second qubit, and the resonator and the direct coupler can be in parallel. In various cases, the direct coupler can couple opposite pads of the first qubit and the second qubit. In various embodiments, a first end of the resonator can be capacitively coupled to the first qubit and the second qubit, a second end of the resonator can be coupled to ground, and the direct coupler can capacitively couple common pads of the first qubit and the second qubit.

25 Claims, 13 Drawing Sheets

(58) Field of Classification Search
USPC .................................................. 327/527, 528
See application file for complete search history.

(56) References Cited

U.S. PATENT DOCUMENTS

| 10,452,991 | B1 | 10/2019 | Ganzhorn et al. |
| 10,546,994 | B1 | 1/2020 | Dial et al. |
| 2010/0182039 | A1* | 7/2010 | Baumgardner ........ B82Y 10/00 326/7 |
| 2010/0194466 | A1* | 8/2010 | Yorozu .................. G06N 10/00 327/528 |
| 2018/0225586 | A1 | 8/2018 | Chow et al. |
| 2018/0260731 | A1 | 9/2018 | Zeng et al. |
| 2019/0228331 | A1 | 7/2019 | Harris et al. |
| 2019/0385088 | A1* | 12/2019 | Naaman ............. G01R 33/0358 |

OTHER PUBLICATIONS

Mundada et al., "Suppression of Qubit Crosstalk in a Tunable Coupling Superconducting Circuit," arXiv:1810.04182v2 [quant-ph], Jun. 3, 2019, 11 pages.
"IBM Quantum Experience," https://quantumexperience.ng.bluemix.net, 2 pages.

* cited by examiner

1200

CAPACITIVELY COUPLING A FIRST QUBIT TO A SECOND QUBIT VIA A NON-TUNABLE MULTI-RESONANT ARCHITECTURE; WHEREIN THE MULTI-RESONANT ARCHITECTURE INCLUDES A FIRST POLE GREATER THAN A FIRST OPERATIONAL FREQUENCY OF THE FIRST QUBIT AND A SECOND OPERATIONAL FREQUENCY OF THE SECOND QUBIT; WHEREIN THE MULTI-RESONANT ARCHITECTURE INCLUDES A SECOND POLE LESS THAN THE FIRST OPERATIONAL FREQUENCY AND THE SECOND OPERATIONAL FREQUENCY, OR WHEREIN THE MULTI-RESONANT ARCHITECTURE INCLUDES A DIRECT COUPLING TERM; WHEREIN THE MULTI-RESONANT ARCHITECTURE EXHIBITS A ZERO COUPLING STRENGTH AND A ZERO ZZ INTERACTION IN A FIRST SET OF QUBIT FREQUENCIES; AND WHEREIN THE MULTI-RESONANT ARCHITECTURE EXHIBITS A NON-ZERO COUPLING STRENGTH AND A ZERO ZZ INTERACTION IN A SECOND SET OF QUBIT FREQUENCIES — 1202

FIG. 12

MULTI-RESONANT COUPLING ARCHITECTURES FOR ZZ INTERACTION REDUCTION

BACKGROUND

The subject disclosure relates generally to superconducting qubits, and more specifically to multi-resonant coupling architectures that reduce ZZ interaction between superconducting qubits while enabling cross resonance gates via the ZX interaction.

Quantum computing systems can be composed of various arrangements of superconducting qubits. In various instances, the qubits can have fixed operational frequencies (e.g., a transmon qubit with a single Josephson junction can have a fixed operational frequency) and can be arranged in two-dimensional arrays on any suitable quantum computing substrate. In various aspects, any qubit in such a two-dimensional array can be coupled to some and/or all of its nearest-neighbor qubits and/or to some and/or all of its next-nearest neighbor qubits.

Conventionally, qubits are coupled together via fixed-frequency microwave resonators (e.g., bus resonators). That is, a first qubit and a second qubit are conventionally coupled by a single fixed-frequency resonator, where a first end of the single fixed-frequency resonator is capacitively coupled to the first qubit, and where a second end of the single fixed-frequency resonator is capacitively coupled to the second qubit. Such a coupling allows the first qubit and the second qubit to exhibit high coherence and/or a strong ZX interaction from cross resonance, which can improve the functioning of the overall quantum computing system. In various instances, qubit devices comprising more than 50 qubits have been successfully implemented based on such cross-resonance interactions, where the qubits are driven with microwave tones at the frequency of neighboring qubits.

A significant disadvantage of conventional couplers, however, is that they result in an always-on ZZ interaction between the coupled qubits. This weak ZZ error accumulates between any conventionally coupled pair of qubits and corrodes the desired cross resonance mechanism used for two-qubit gates. In other words, this ZZ error inhibits the effectiveness and/or efficacy of quantum computing systems. Conventional systems and/or techniques for dealing with the always-on ZZ error include echoing and tunable-frequency coupling elements. Echoing involves using additional pulses to cancel the ZZ interaction. These pulses, however, require time to implement, which can significantly eat into the coherence budget due to finite coherence times. Tunable-frequency couplers can be used to reduce and/or eliminate the ZZ interaction. However, adding tunable-frequency elements to quantum computing systems often results in coherence degradation. In other words, conventional systems and/or techniques for reducing the always-on ZZ interaction have corresponding negative impacts on coherence times.

In various instances, embodiments of the invention can solve one or more of these problems in the prior art.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate multi-resonant coupling architectures for ZZ interaction reduction are described.

According to one or more embodiments, a device is provided. The device can comprise a first qubit, a second qubit, and a multi-resonant architecture. In various aspects, the multi-resonant architecture can comprise a first resonator that capacitively couples the first qubit to the second qubit and a second resonator that capacitively couples the first qubit to the second qubit. In various embodiments, the first qubit can have a first operational frequency, and the second qubit can have a second operational frequency. In various cases, the first resonator can have a first resonant frequency that is less than the first operational frequency and that is less than the second operational frequency. In various aspects, the second resonator can have a second resonant frequency that is greater than the first operational frequency and that is greater than the second operational frequency. In various embodiments, the first resonator and the second resonator can be λ/2 resonators, and the first resonator and the second resonator can be in parallel. In various embodiments, the first resonant frequency can be about 3 gigahertz (GHz), the second resonant frequency can be about 6 GHz, and the first operational frequency and the second operational frequency can be between 4.5 GHz and 5.5 GHz. In various instances, the first resonant frequency, the second resonant frequency, the first operational frequency, and the second operational frequency can be fixed.

According to one or more embodiments, a device is provided. The device can comprise a first qubit, a second qubit, and a multi-resonant architecture. In various aspects, the multi-resonant architecture can comprise a resonator. In various instances, a first end of the resonator can be capacitively coupled to the first qubit and to the second qubit. In various aspects, a second end of the resonator can be coupled to ground. In various embodiments, the first qubit can have a first operational frequency, and the second qubit can have a second operational frequency. In various cases, the resonator can have a first harmonic frequency that is less than the first operational frequency and that is less than the second operational frequency. In various aspects, the resonator can have a second harmonic frequency that is greater than the first operational frequency and that is greater than the second operational frequency. In various embodiments, the resonator can be a λ/4 resonator. In various embodiments, the first harmonic frequency can be about 2 gigahertz (GHz), the second harmonic frequency can be about 6 GHz, and the first operational frequency and the second operational frequency can be between 4.5 GHz and 5.5 GHz. In various instances, the first harmonic frequency, the second harmonic frequency, the first operational frequency, and the second operational frequency can be fixed.

According to one or more embodiments, a device is provided. The device can comprise a first qubit, a second qubit, and a multi-resonant architecture. In various aspects, the multi-resonant architecture can comprise a resonator and a differential direct coupler. In various instances, the resonator can capacitively couple the first qubit to the second qubit, and the differential direct coupler can capacitively couple the first qubit to the second qubit. In various cases, the differential direct coupler can capacitively couple opposite pads of the first qubit and the second qubit. In various embodiments, the first qubit can have a first operational frequency, and the second qubit can have a second operational frequency. In various cases, the resonator can have a resonant frequency that is greater than the first operational frequency and that is greater than the second operational frequency. In various embodiments, the resonator can be a $\lambda/2$ resonator, and the resonator and the differential direct coupler can be in parallel. In various embodiments, the resonant frequency can be about 6 gigahertz (GHz), and the first operational frequency and the second operational frequency can be between 4.5 GHz and 5.5 GHz. In various instances, the resonant frequency, the first operational frequency, and the second operational frequency can be fixed.

According to one or more embodiments, a device is provided. The device can comprise a first qubit, a second qubit, and a multi-resonant architecture. In various aspects, the multi-resonant architecture can comprise a resonator and a direct coupler. In various instances, a first end of the resonator can be capacitively coupled to the first qubit and to the second qubit, and a second end of the resonator can be coupled to ground. In various aspects, the direct coupler can capacitively couple the first qubit to the second qubit. In various cases, the direct coupler can capacitively couple common pads of the first qubit and the second qubit. In various embodiments, the first qubit can have a first operational frequency, and the second qubit can have a second operational frequency. In various cases, the resonator can have a resonant frequency that is greater than the first operational frequency and that is greater than the second operational frequency. In various embodiments, the resonator can be a $\lambda/4$ resonator. In various embodiments, the resonant frequency can be about 6 gigahertz (GHz), and the first operational frequency and the second operational frequency can be between 4.5 GHz and 5.5 GHz. In various instances, the resonant frequency, the first operational frequency, and the second operational frequency can be fixed.

According to one or more embodiments, an apparatus is provided. The apparatus can comprise a first transmon qubit having a first operational frequency, a second transmon qubit having a second operational frequency, and a multi-resonant architecture. In various aspects, the multi-resonant architecture can capacitively couple the first transmon qubit to the second transmon qubit. In various instances, the multi-resonant architecture can have a first resonant frequency that is less than the first operational frequency and that is less than the second operational frequency, and can have a second resonant frequency that is greater than the first operational frequency and that is greater than the second operational frequency. In various embodiments, the multi-resonant architecture can comprise a first $\lambda/2$ resonator capacitively coupled to the first transmon qubit and to the second transmon qubit, wherein the first $\lambda/2$ resonator exhibits the first resonant frequency. In various instances, the multi-resonant architecture can comprise a second $\lambda/2$ resonator capacitively coupled to the first transmon qubit and to the second transmon qubit, wherein the second $\lambda/2$ resonator exhibits the second resonant frequency. In various cases, the first $\lambda/2$ resonator and the second $\lambda/2$ resonator can be in parallel. In various other embodiments, the multi-resonant architecture can comprise a $\lambda/4$ resonator. In various instances, a first end of the $\lambda/4$ resonator can be coupled between coupling capacitors of the first transmon qubit and the second transmon qubit, and a second end of the $\lambda/4$ resonator can be shorted to ground. In various cases, a first harmonic of the $\lambda/4$ resonator can be the first resonant frequency, and a second harmonic of the $\lambda/4$ resonator can be the second resonant frequency.

As mentioned above, a pair of fixed-frequency qubits are conventionally coupled together via a fixed-frequency microwave resonator. Specifically, for a first qubit and a second qubit, a first end of the fixed-frequency microwave resonator is capacitively coupled to the first qubit and a second end of the fixed-frequency microwave resonator is capacitively coupled to the second qubit. Such a coupling structure can result in high coherence and/or strong ZX interaction between the first qubit and the second qubit. However, such a coupling structure also generates an always-on ZZ interaction between the first qubit and the second qubit. This ZZ interaction can negatively affect the performance of a quantum computing system that includes the first qubit and the second qubit. Thus, elimination, minimization, suppression, and/or reduction of this ZZ interaction can improve the functioning of the quantum computing system.

As explained above, there are two main conventional systems and/or techniques for suppressing and/or reducing ZZ interactions. The first conventional system and/or technique is echoing. Echoing involves injecting additional pulses into the quantum computing system to counteract, cancel, and/or destructively interfere with the ZZ interactions. However, injecting these pulses requires time, and the time spent injecting these pulses can eat into the coherence budget of the quantum computing system. The second conventional system and/or technique for dealing with ZZ interactions is to use tunable-frequency elements. Introducing tunable-frequency elements into the quantum computing system can eliminate and/or reduce the ZZ interaction. However, the use and/or complexity of tunable-frequency elements introduces a corresponding coherence degradation. In other words, conventional systems and/or techniques reduce ZZ interactions between a coupled pair of qubits at the cost of decreased coherence times.

Various embodiments of the invention can solve one or more of these problems in the prior art. In various aspects, embodiments of the invention can provide a multi-resonant coupling architecture that can couple a first qubit to a second qubit. In various instances, such a multi-resonant coupling architecture can reduce the ZZ interaction between the first qubit and the second qubit without reducing the coupling strength and/or the ZX interaction between the first qubit and the second qubit. In various instances, such a multi-resonant coupling architecture can comprise fixed-frequency and/or non-tunable elements, and so such a multi-resonant coupling architecture can avoid introducing into a quantum computing system the coherence degradation that normally accompanies tunable-frequency elements. Moreover, such a multi-resonant coupling architecture can, in various aspects, dispense with the need to inject echoes into the quantum computing system. In other words, various embodiments of the invention can provide multi-resonant coupling architectures that can reduce ZZ interactions between coupled qubits without introducing a corresponding decrease in coherence times, unlike conventional systems and/or techniques.

Various multi-resonant coupling architectures can be implemented to achieve these improved results. Consider a first qubit having a first operational frequency and a second qubit having a second operational frequency. In some embodiments, the multi-resonant coupling architecture can include a first $\lambda/2$ resonator and a second $\lambda/2$ resonator. In various instances, a first end of the first $\lambda/2$ resonator can couple to a first coupling capacitor of the first qubit, and a second end of the first $\lambda/2$ resonator can couple to a first coupling capacitor of the second qubit. Similarly, a first end of the second $\lambda/2$ resonator can couple to a second coupling capacitor of the first qubit, and a second end of the second $\lambda2$ resonator can couple to a second coupling capacitor of the second qubit. In other words, the first $\lambda/2$ resonator can capacitively couple the first qubit to the second qubit, and the second $\lambda/2$ resonator can capacitively couple the first qubit to the second qubit, such that the first $\lambda/2$ resonator and the second $\lambda/2$ resonator are in parallel. In various instances, the first $\lambda/2$ resonator can exhibit a first resonant frequency that is less than the first operational frequency and that is less than the second operational frequency. In various aspects, the second $\lambda/2$ resonator can exhibit a second resonant frequency that is greater than the first operational frequency and that is greater than the second operational frequency. Moreover, in various aspects, the first resonant frequency and the second resonant frequency can be fixed. In various embodiments, such a multi-resonant coupling architecture can reduce (e.g., in some cases, by an order of magnitude and/or more) ZZ interaction between the first qubit and the second qubit without correspondingly reducing the coupling strength and/or the cross-resonance gate speed between the first qubit and the second qubit. Moreover, such a multi-resonant coupling architecture can avoid introducing coherence degradation (e.g., echoes and/or tunable-frequency elements can be not required).

In other embodiments, the multi-resonant coupling architecture can include a $\lambda/4$ resonator. In various aspects, a first end of the $\lambda/4$ resonator can couple to a coupling capacitor of the first qubit, and the first end of the $\lambda/4$ resonator can also couple to a coupling capacitor of the second qubit. That is, in various aspects, the first end of the $\lambda/4$ resonator can be capacitively coupled to both the first qubit and the second qubit. In various instances, a second end of the $\lambda/4$ resonator can be coupled to ground. In various aspects, the $\lambda/4$ resonator can exhibit a first harmonic frequency that is less than the first operational frequency and that is less than the second operational frequency. In various instances, the $\lambda/4$ resonator can exhibit a second harmonic frequency that is greater than the first operational frequency and that is greater than the second operational frequency. Moreover, in various aspects, the first harmonic frequency and the second harmonic frequency can be fixed. In various embodiments, such a multi-resonant coupling architecture can reduce (e.g., in some cases, by an order of magnitude and/or more) ZZ interaction between the first qubit and the second qubit without correspondingly reducing the coupling strength and/or cross-resonance gate speed between the first qubit and the second qubit. Moreover, such a multi-resonant coupling architecture can avoid introducing coherence degradation (e.g., echoes and/or tunable-frequency elements can be not required).

In still other embodiments, the multi-resonant coupling architecture can include a $\lambda/2$ resonator and a differential direct coupler. In various instances, a first end of the $\lambda/2$ resonator can couple to a first coupling capacitor of the first qubit, and a second end of the a $\lambda/2$ resonator can couple to a first coupling capacitor of the second qubit. Similarly, a first end of the differential direct coupler can couple to a second coupling capacitor of the first qubit, and a second end of the differential direct coupler can couple to a second coupling capacitor of the second qubit. In other words, the $\lambda/2$ resonator can capacitively couple the first qubit to the second qubit, and the differential direct coupler can capacitively couple the first qubit to the second qubit, such that the $\lambda/2$ resonator and the differential direct coupler are in parallel. In various aspects, the differential direct coupler can couple opposite pads of the first qubit and the second qubit. In various instances, the $\lambda/2$ resonator can exhibit a resonant frequency that is greater than the first operational frequency and that is greater than the second operational frequency. Moreover, in various aspects, the resonant frequency can be fixed. In various embodiments, such a multi-resonant coupling architecture can reduce (e.g., in some cases, by an order of magnitude and/or more) ZZ interaction between the first qubit and the second qubit without correspondingly reducing the coupling strength and/or cross-resonance gate speed between the first qubit and the second qubit. Moreover, such a multi-resonant coupling architecture can avoid introducing coherence degradation (e.g., echoes and/or tunable-frequency elements can be not required).

In yet other embodiments, the multi-resonant coupling architecture can include a $\lambda/4$ resonator and a direct coupler. In various aspects, a first end of the $\lambda/4$ resonator can couple to a first coupling capacitor of the first qubit, and the first end of the $\lambda/4$ resonator can also couple to a first coupling capacitor of the second qubit. That is, in various aspects, the first end of the $\lambda/4$ resonator can be capacitively coupled to both the first qubit and the second qubit. In various instances, a second end of the $\lambda/4$ resonator can be coupled to ground. In various cases, a first end of the direct coupler can couple to a second coupling capacitor of the first qubit, and a second end of the direct coupler can couple to a second coupling capacitor of the second qubit. In various cases, the direct coupler can couple common pads of the first qubit and the second qubit. In various aspects, the $\lambda/4$ resonator can exhibit a resonant frequency that is greater than the first operational frequency and that is greater than the second operational frequency. Moreover, in various aspects, the resonant frequency can be fixed. In various embodiments, such a multi-resonant coupling architecture can reduce (e.g., in some cases, by an order of magnitude and/or more) ZZ interaction between the first qubit and the second qubit without correspondingly reducing the coupling strength and/ or cross-resonance gate speed between the first qubit and the second qubit. Moreover, such a multi-resonant coupling architecture can avoid introducing coherence degradation (e.g., echoes and/or tunable-frequency elements can be not required).

Therefore, various embodiments of the invention can provide multi-resonant coupling architectures that can reduce ZZ interactions between coupled qubits without correspondingly reducing coherence times, unlike conventional systems and/or techniques. Thus, various embodiments of the invention constitute a concrete technical improvement over the prior art.

DESCRIPTION OF THE DRAWINGS

FIG. 12 illustrates a flow diagram of an example, non-limiting method that facilitates ZZ interaction reduction in accordance with one or more embodiments described herein.

DETAILED DESCRIPTION

Figure 1:
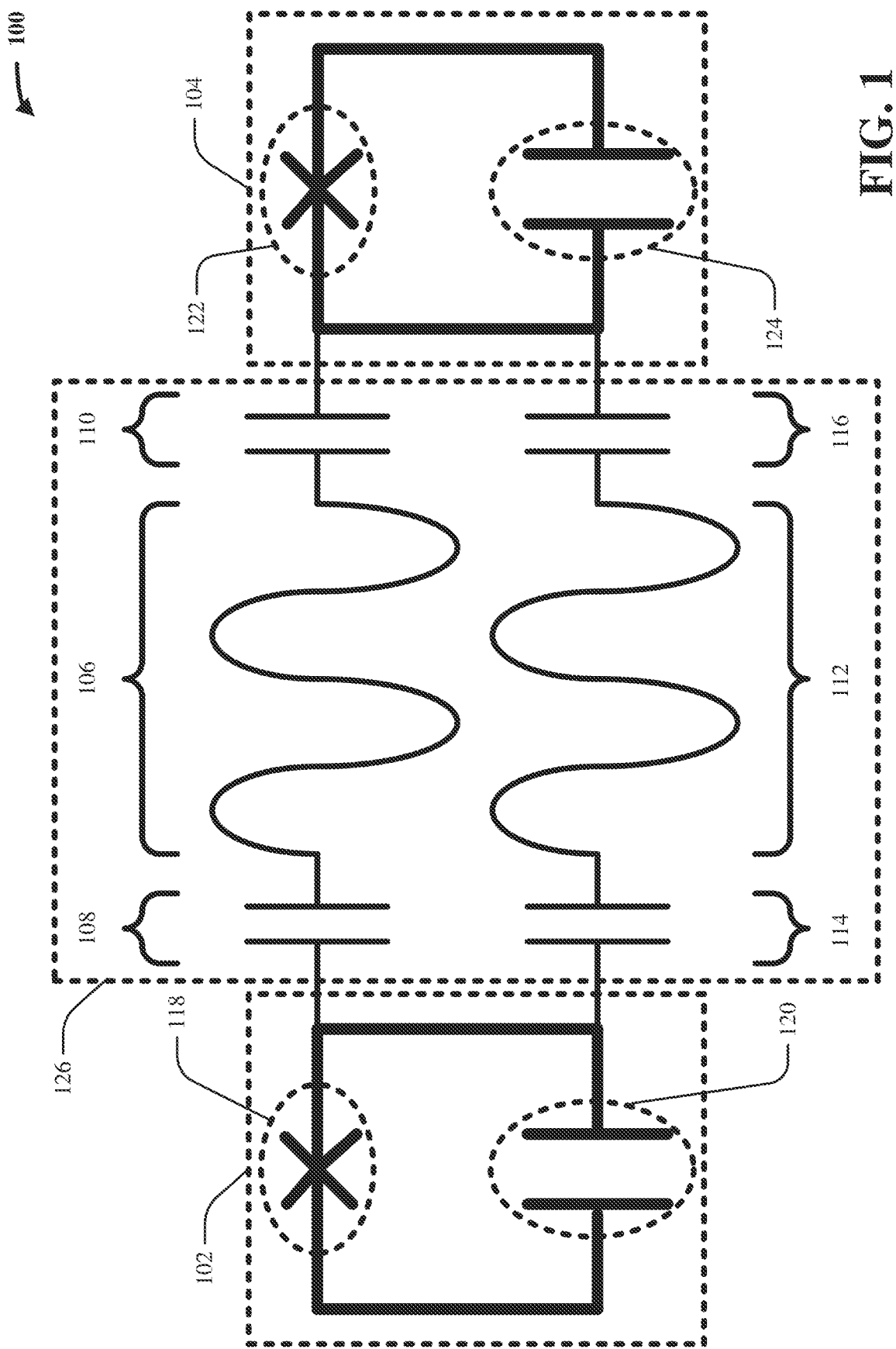
FIG. 1 illustrates a block diagram of an example, non-limiting system including two resonators that facilitates ZZ interaction reduction in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Consider two transmon qubits coupled by a fixed-frequency bus resonator, as in conventional systems and/or techniques. The coupling strength can be quantified by the exchange coupling J, which can be given by:

$$J = \frac{g_1 g_2 (\Delta_1 + \Delta_2)}{2 \Delta_1 \Delta_2}$$

where $\Delta_1$ is the difference between the operational frequency of the first transmon qubit and the resonant frequency of the fixed-frequency bus resonator, where $\Delta_2$ is the difference between the operational frequency of the second transmon qubit and the resonant frequency of the fixed-frequency bus resonator, where $g_1$ is the coupling strength of the first transmon qubit to the fixed-frequency bus resonator, and where $g_2$ is the coupling strength of the second transmon qubit to the fixed-frequency bus resonator. Also consider two transmon qubits coupled by a direct coupler; that is, any suitable, short section of transmission line (e.g., short in the sense that its resonance frequency is greater than about 30 GHz), which can give rise to a qubit frequency-independent coupling at typical transmon qubit frequencies of around 5 GHz. In this case the qubit coupling is also given by a certain value of J set by the direct coupler geometry. In both these instances, the Hamiltonian H of these conventionally coupled qubits (e.g., two qubits coupled by a single fixed-frequency microwave resonator or coupled by a direct coupler) can be described by the following equation:

$$H = \sum_i \left[ \omega_i \hat{n}_i + \frac{\alpha_i}{2} \hat{n}_i (\hat{n}_i - 1) \right] + J \left( \hat{a}_1 \hat{a}_2^\dagger + \hat{a}_2 \hat{a}_1^\dagger \right)$$

where i can take values 1 or 2 to represent the first or second transmon qubit, wherein $\omega_i$ is the resonance frequency of the i-th transmon qubit, where $\hat{n}_i$ denotes the number of excitations in the i-th transmon qubit, where $\alpha_i$ is the anharmonicity of the i-th transmon qubit, and where $\hat{a}_1 \hat{a}_2^\dagger + \hat{a}_2 \hat{a}_1^\dagger$ represents the exchange coupling between qubits 1 and 2 ($\hat{a}_i$ is the i-th qubit annihilation operator and $\hat{a}_i^\dagger$ is the i-th qubit creation operator). In this Hamiltonian, the always on ZZ interaction can be given as:

$$ZZ = \frac{2J^2 (\alpha_1 + \alpha_2)}{(\Delta + \alpha_1)(\Delta - \alpha_2)}$$

where $\Delta$ is the detuning between the two qubits and where all other symbols are defined in the two above equations. This arises from the fact that the sum of the |00> and |11>state energies of the two transmon qubits is different from the sum of the |01> and |10> state energies. Although a low ZZ interaction between the two transmon qubits is desirable, a high coupling strength between the two transmon qubits is also desirable, since conversely the ZX interaction from qubit 1 to 2 (e.g., the strength of cross-resonance) is given by:

$$ZX = \frac{J \Omega_1}{\Delta} \left( \frac{\alpha_1}{\Delta + \alpha_1} \right)$$

where J, $a_1$, and $\Delta$ are as defined above, and where $\Omega_1$ is the cross-resonance drive strength applied to qubit 1. As shown by the above equations, one way to increase the ratio of ZX to ZZ (that is, to increase the ratio of wanted to unwanted interaction) would be to decrease J. However, this increases the overall time of the gate operation, thus leading to degradation of the fidelity due to loss of coherence.

As mentioned above, conventional systems and/or techniques for reducing, suppressing, eliminating, and/or minimizing the ZZ interaction without also reducing, suppressing, eliminating, and/or minimizing the ZX interaction implement echoing and/or tunable-frequency elements. Echoing involves injecting multiple pulse signals into a quantum computing system to counteract, cancel, negate, correct, and/or destructively interfere with the ZZ interaction. However, time is required to inject such pulse signals into the quantum computing system, and that time can eat into the already-limited coherence budget of the quantum computing system. Tunable-frequency elements can be used to ameliorate the ZZ interaction. However, tunable-frequency elements are also associated with coherence degradation. Thus, conventional systems and/or techniques reduce the ZZ interaction at the expense of decreased coherence times. Various embodiments of the invention, however, can reduce the ZZ interaction without this corresponding decrease in coherence times.

The inventors of various embodiments of the invention recognized that the ZZ interaction can, in various instances, be reduced and/or cancelled while maintaining a finite J by incorporating a second coupler mode. In various instances, the Hamiltonian H when a second coupler mode is incorporated can be described by the following equation:

$$H = \sum_i \left( \omega_i \hat{n}_i + \frac{\alpha_i}{2} \hat{n}_i (\hat{n}_i - 1) + \sum_j g_{ij} \left( \hat{a}_i \hat{b}_j^\dagger + \hat{b}_j \hat{a}_i^\dagger \right) \right) +$$
$$\sum_j \gamma_j \hat{b}_j^\dagger \hat{b}_j + J_0 \left( \hat{a}_1 \hat{a}_2^\dagger + \hat{a}_2 \hat{a}_1^\dagger \right)$$

where i can take values 1 or 2 to represent the first or second transmon qubit, wherein $\omega_i$, $\alpha_i$, $\hat{n}_i$, $\hat{a}_i$ are defined above, where j is summed over the number of resonator modes coupling the first transmon qubit to the second transmon qubit, where $\gamma_j$ is the frequency of the resonator mode, where $\hat{b}_j^\dagger \hat{b}_j$ is the number of excitations in the resonator mode, where $g_{ij}$ denotes the coupling between the i-th transmon qubit and the coupler mode j, and where $(\hat{a}_i \hat{b}_j^\dagger + \hat{b}_j \hat{a}_i^\dagger)$ represents the exchange between the i-th transmon qubit and the coupler mode j. In this form, the remaining $J_0$ coupled term is due to a direct coupler if one exists.

Various embodiments of the invention can provide multi-resonant coupling architectures that can reduce the ZZ interaction between two qubits while maintaining a finite exchange coupling J and without a corresponding decrease in coherence times. Again, consider a first qubit having a first operational frequency and a second qubit having a second operational frequency. In various aspects, a multi-resonant architecture can capacitively couple the first qubit to the second qubit. In various instances, the multi-resonant architecture can have a first pole that is greater than the first operational frequency and that is greater than the second operational frequency. In various instances, the multi-resonant architecture can have a second pole that is less than the first operational frequency and that is less than the second operational frequency. In various cases, rather than the second pole, the multi-resonant architecture can have a direct coupling term (e.g., a direct coupler that capacitively couples the first qubit to the second qubit). In various instances, the multi-resonant architecture can exhibit a zero ZZ interaction and a zero exchange coupling J in a first set of qubit frequencies. In various aspects, the multi-resonant architecture can exhibit a zero ZZ interaction and a non-zero exchange coupling J in a second set of qubit frequencies. In various cases, the multi-resonant architecture can be non-tunable.

In various embodiments, the multi-resonant architecture can comprise a first resonator and a second resonator. In various instances, the first resonator can capacitively couple the first qubit to the second qubit. That is, a first end of the first resonator can couple to a first coupling capacitor of the first qubit, and a second end of the first resonator can couple to a first coupling capacitor of the second qubit. Similarly, the second resonator can capacitively couple the first qubit to the second qubit. That is, a first end of the second resonator can couple to a second coupling capacitor of the first qubit, and a second end of the second resonator can couple to a second coupling capacitor of the second qubit. In various instances, the first resonator can be in parallel with the second resonator. In various aspects, the first resonator and the second resonator can both be $\lambda/2$ resonators. In various instances, the first resonator can have a first resonant frequency that is less than the first operational frequency of the first qubit and that is less than the second operational frequency of the second qubit. In various cases, the second resonator can have a second resonant frequency that is greater than the first operational frequency of the first qubit and that is greater than the second operational frequency of the second qubit. In various instances, the first resonant frequency can be about 3 GHz, the second resonant frequency can be about 6 GHz, and the first operational frequency and the second operational frequency can be in the range of 4.5 GHz to 5.5 GHz. In various instances, the first resonator and/or the second resonator can be non-tunable. In various aspects, such a multi-resonant architecture can reduce (e.g., in some cases, by an order of magnitude and/or more) the ZZ interaction between the first qubit and the second qubit without correspondingly decreasing the ZX interaction and/or the exchange coupling J between the first qubit and the second qubit. Moreover, such a multi-resonant architecture can accomplish this result without implementing many-pulse echoes and/or without tunable-frequency elements. Thus, such a multi-resonant architecture can, in various instances, reduce the ZZ interaction without the coherence degradation that accompanies conventional systems and/or techniques.

In various other embodiments, the multi-resonant architecture can comprise a resonator. In various instances, a first end of the resonator can be capacitively coupled to a coupling capacitor of the first qubit and can be capacitively coupled to a coupling capacitor of the second qubit. That is, the first end of the resonator can be capacitively coupled to both the first qubit and the second qubit. In various instances, a second end of the resonator can be coupled to ground. In various aspects, the resonator can be a $\lambda/4$ resonator. In various instances, the resonator can have a first harmonic frequency that is less than the first operational frequency of the first qubit and that is less than the second operational frequency of the second qubit. In various cases, the resonator can have a second harmonic frequency that is greater than the first operational frequency of the first qubit and that is greater than the second operational frequency of the second qubit. In various instances, the first harmonic frequency can be about 2 GHz, the second harmonic frequency can be about 6 GHz, and the first operational frequency and the second operational frequency can be in the range of 4.5 GHz to 5.5 GHz. In various instances, the resonator can be non-tunable. In various aspects, such a multi-resonant architecture can reduce (e.g., in some cases, by an order of magnitude and/or more) the ZZ interaction between the first qubit and the second qubit without correspondingly decreasing the ZX interaction and/or the exchange coupling J between the first qubit and the second qubit. Moreover, such a multi-resonant architecture can accomplish this result without implementing many-pulse echoes and/or without tunable-frequency elements. Thus, such a multi-resonant architecture can, in various instances, reduce the ZZ interaction without the coherence degradation that accompanies conventional systems and/or techniques.

In various other embodiments, the multi-resonant architecture can comprise a resonator and a differential direct coupler. In various instances, the resonator can capacitively couple the first qubit to the second qubit. That is, a first end of the resonator can couple to a first coupling capacitor of the first qubit, and a second end of the resonator can couple to a first coupling capacitor of the second qubit. Similarly, the differential direct coupler can, in various instances, capacitively couple the first qubit to the second qubit. That is, a first end of the differential direct coupler can couple to a second coupling capacitor of the first qubit, and a second end of the differential direct coupler can couple to a second coupling capacitor of the second qubit. In various instances, the differential direct coupler can couple together opposite pads of the first qubit and the second qubit. In various cases, the resonator can be in parallel with the differential direct coupler. In various aspects, the resonator can be a $\lambda/2$ resonator. In various instances, the resonator can have a resonant frequency that is greater than the first operational frequency of the first qubit and that is greater than the second operational frequency of the second qubit. In various instances, the resonant frequency can be about 6 GHz, and the first operational frequency and the second operational frequency can be in the range of 4.5 GHz to 5.5 GHz. In various instances, the resonator can be non-tunable. In various aspects, the differential direct coupler can be any suitable, short section of transmission line (e.g., short in the sense that its resonance frequency is greater than about 30 GHz), which can give rise to a frequency-independent coupling at typical transmon qubit frequencies of around 5 GHz. In various aspects, such a multi-resonant architecture can reduce (e.g., in some cases, by an order of magnitude and/or more) the ZZ interaction between the first qubit and the second qubit without correspondingly decreasing the ZX interaction and/or the exchange coupling J between the first qubit and the second qubit. Moreover, such a multi-resonant architecture can accomplish this result without implementing many-pulse echoes and/or without tunable-frequency elements. Thus, such a multi-resonant architecture can, in various instances, reduce the ZZ interaction without the coherence degradation that accompanies conventional systems and/or techniques.

In various other embodiments, the multi-resonant architecture can comprise a resonator and a direct coupler. In various instances, a first end of the resonator can be capacitively coupled to both the first qubit and to the second qubit. That is, a first end of the resonator can couple to a first coupling capacitor of the first qubit, and the first end of the resonator can also couple to a first coupling capacitor of the second qubit. In various aspects, the direct coupler can capacitively couple the first qubit to the second qubit. That is, a first end of the direct coupler can couple to a second coupling capacitor of the first qubit, and a second end of the direct coupler can couple to a second coupling capacitor of the second qubit. In various instances, the direct coupler can couple together common pads of the first qubit and the second qubit. In various aspects, the resonator can be a $\lambda/4$ resonator. In various instances, the resonator can have a resonant frequency that is greater than the first operational frequency of the first qubit and that is greater than the second operational frequency of the second qubit. In various instances, the resonant frequency can be about 6 GHz, and the first operational frequency and the second operational frequency can be in the range of 4.5 GHz to 5.5 GHz. In various instances, the resonator can be non-tunable. In various aspects, the direct coupler can be any suitable, short section of transmission line (e.g., short in the sense that its resonance frequency is greater than about 30 GHz), which can give rise to a frequency-independent coupling at typical transmon qubit frequencies of around 5 GHz. In various aspects, such a multi-resonant architecture can reduce (e.g., in some cases, by an order of magnitude and/or more) the ZZ interaction between the first qubit and the second qubit without correspondingly decreasing the ZX interaction and/or the exchange coupling J between the first qubit and the second qubit. Moreover, such a multi-resonant architecture can accomplish this result without implementing many-pulse echoes and/or without tunable-frequency elements. Thus, such a multi-resonant architecture can, in various instances, reduce the ZZ interaction without the coherence degradation that accompanies conventional systems and/or techniques.

Various embodiments of the invention include novel systems and/or techniques for facilitating multi-resonant coupling architectures for ZZ interaction reduction that are not abstract, that are not natural phenomena, that are not laws of nature, and that cannot be performed as a set of mental acts by a human. Instead, various embodiments of the invention include systems and/or techniques for facilitating ZZ interaction reduction that do not correspondingly reduce ZX interaction and/or exchange coupling J, that do not require many-pulse echoes, and/or that do not require tunable-frequency elements. Reduction of ZX interactions can negatively affect performance of a quantum computing system. Additionally, implementing echoes and/or tunable-frequency elements can negatively affect the coherence budget of a quantum computing system. Since various embodiments of the invention can reduce ZZ interactions without correspondingly reducing ZX interactions and without implementing echoes and/or tunable-frequency elements, various embodiments of the invention can reduce unwanted ZZ interactions while maintaining a non-zero exchange coupling J without the coherence degradation that normally accompanies conventional systems and/or techniques. In other words, embodiments of the invention provide for novel qubit-coupling architectures that can be implemented in quantum computing systems (e.g., on quantum computing chips/substrates) in order to improve the performance and/or functioning of the quantum computing systems. Therefore, various embodiments of the invention constitute concrete technical improvements over the prior art.

In various aspects, it should be appreciated that the figures of this disclosure are exemplary and non-limiting only and are not necessarily drawn to scale.

FIG. 1 illustrates a block diagram of an example, non-limiting system 100 including two resonators that can facilitate ZZ interaction reduction in accordance with one or more embodiments described herein. As shown, in various aspects, the system 100 can comprise a first qubit 102 and a second qubit 104. As shown in FIG. 1, the first qubit 102 can be a fixed-frequency transmon qubit. That is, the first qubit 102 can comprise a Josephson junction 118 that is shunted by a capacitor 120. In various instances, however, the first qubit 102 can be any suitable type of superconducting qubit (e.g., charge qubit, phase qubit, flux qubit). In various aspects, the first qubit 102 can be any suitable fixed-frequency superconducting qubit (e.g., a qubit whose operational frequency is not tunable). As also shown in FIG. 1, the second qubit 104 can be a fixed-frequency transmon qubit. That is, the second qubit 104 can comprise a Josephson junction 122 that is shunted by a capacitor 124. In various instances, however, the second qubit 104 can be any suitable type of superconducting qubit (e.g., charge qubit, phase qubit, flux qubit). In various aspects, the second qubit 104 can be any suitable fixed-frequency superconducting qubit (e.g., a qubit whose operational frequency is not tunable).

In various other embodiments, the first qubit 102 and/or the second qubit 104 can be tunable and/or weakly tunable.

In various embodiments, the first qubit 102 can have a first operational frequency. In various instances, the second qubit 104 can have a second operational frequency. In various aspects, the first operational frequency can have any suitable value, and the second operational frequency can have any suitable value. In various instances, the first operational frequency can be within the range from 4.5 GHz to 5.5 GHz. In various aspects, the second operational frequency can be within the range of 4.5 GHz to 5.5 GHz. In various instances, the first operational frequency and the second operational frequency can be about 150 mega Hertz (MHz) apart (e.g., a detuning and/or frequency separation of 150 MHz, as measured within any suitable measurement resolution and/or measurement error). For example, the first operational frequency can be about 150 MHz less than the second operational frequency. In various embodiments, the first qubit 102 can have any suitable anharmonicity, the second qubit 104 can have any suitable anharmonicity, and the first qubit 102 and the second qubit 104 can be in a straddling regime, where their frequency separation is smaller than both qubits' anharmonicities.

In various embodiments, the first qubit 102 can have a first coupling capacitor 108 and a second coupling capacitor 114. Similarly, the second qubit 104 can have a first coupling capacitor 110 and a second coupling capacitor 116. In various instances, the coupling capacitors 108, 110, 114, and 116 can be any suitable coupling capacitors used in quantum computing systems.

In various instances, the system 100 can comprise a first resonator 106 and a second resonator 112. In various aspects, the first resonator 106 can be any suitable fixed-frequency microwave resonator used in quantum computing systems (e.g., a bus resonator). In various aspects, the first resonator 106 can be any suitable λ/2 resonator. Similarly, in various instances, the second resonator 112 can be any suitable fixed-frequency microwave resonator used in quantum computing systems (e.g., a bus resonator). In various aspects, the second resonator 112 can be any suitable λ/2 resonator.

As shown, the first resonator 106 can, in various embodiments, capacitively couple the first qubit 102 to the second qubit 104. Specifically, in various instances, the first resonator 106 can have a first end (e.g., the left-hand end of the first resonator 106 as depicted in FIG. 1) and a second end (e.g., the right-hand end of the first resonator 106 as depicted in FIG. 1). In various cases, the first end of the first resonator 106 can be coupled to the first coupling capacitor 108 of the first qubit 102. In various aspects, the second end of the first resonator 106 can be coupled to the first coupling capacitor 110 of the second qubit 104. Similarly, the second resonator 112 can, in various embodiments, capacitively couple to the first qubit 102 to the second qubit 104. Specifically, in various instances, the second resonator 112 can have a first end (e.g., the left-hand end of the second resonator 112 as depicted in FIG. 1) and a second end (e.g., the right-hand end of the second resonator 112 as depicted in FIG. 1). In various cases, the first end of the second resonator 112 can be coupled to the second coupling capacitor 114 of the first qubit 102. In various aspects, the second end of the second resonator 112 can be coupled to the second coupling capacitor 116 of the second qubit 104.

As shown, in various instances, the first resonator 106 and the second resonator 112 can be in parallel (e.g., as opposed to in series).

In various embodiments, the first resonator 106 can have a first resonant frequency. In various cases, the first resonant frequency can be less than the first operational frequency of the first qubit 102. In various instances, the first resonant frequency can also be less than the second operational frequency of the second qubit 104. In various embodiments, the second resonator 112 can have a second resonant frequency. In various cases, the second resonant frequency can be greater than the first operational frequency of the first qubit 102. In various instances, the second resonant frequency can also be greater than the second operational frequency of the second qubit 104. In various embodiments, the first resonant frequency can be about 3 GHz (e.g., the first resonant frequency can be within any suitable measurement resolution and/or measurement error of 3 GHz). In various instances, the second resonant frequency can be about 6 GHz (e.g., the second resonant frequency can be within any suitable measurement resolution and/or measurement error of 6 GHz). In various aspects, the resonant frequency of a fixed-frequency microwave resonator can depend upon the shape and/or size of the fixed-frequency microwave resonator (e.g., low resonant frequencies can be obtained with long microwave resonators, while high resonant frequencies can be obtained with short microwave resonators).

In various instances, the first resonator 106, the second resonator 112, and the coupling capacitors 108, 110, 114, and 116 can be considered as a multi-resonant coupling architecture 126. As explained above, the multi-resonant coupling architecture 126 can reduce ZZ interaction between the first qubit 102 and the second qubit 104 without correspondingly decreasing the ZX interaction (e.g., exchange coupling J) between the first qubit 102 and the second qubit 104. Moreover, the multi-resonant coupling architecture 126 does not require the injection of many-pulse echoes into the system 100. Furthermore, the multi-resonant coupling architecture 126 can be constructed without tunable-frequency elements (e.g., the first resonator 106 and the second resonator 112 can be fixed-frequency microwave resonators). Thus, the multi-resonant coupling architecture 126 can, in various aspects, reduce ZZ interaction between the first qubit 102 and the second qubit 104 without correspondingly degrading coherence times of the system 100. Thus, the multi-resonant coupling architecture 126 can constitute a concrete and tangible technical improvement over conventional systems and/or techniques.

Figure 2:
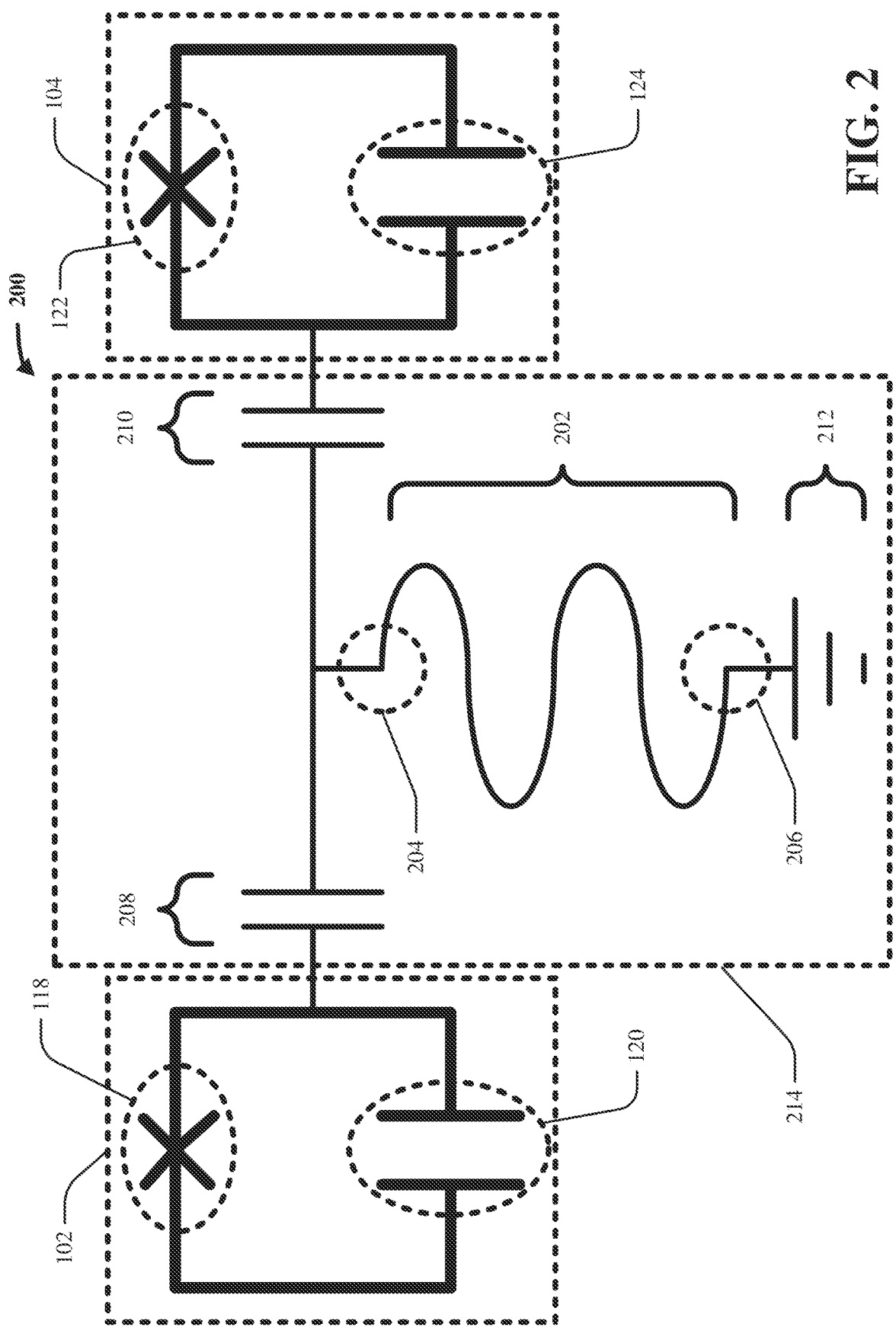
FIG. 2 illustrates a block diagram of an example, non-limiting system including one resonator that facilitates ZZ interaction reduction in accordance with one or more embodiments described herein.

FIG. 2 illustrates a block diagram of an example, non-limiting system 200 including one resonator that can facilitate ZZ interaction reduction in accordance with one or more embodiments described herein. As shown, in various aspects, the system 200 can comprise the first qubit 102 and the second qubit 104, substantially as described above.

As shown, in various embodiments, the first qubit 102 can have a coupling capacitor 208. Similarly, the second qubit 104 can have a coupling capacitor 210. In various instances, the coupling capacitors 208 and 210 can be any suitable coupling capacitors used in quantum computing systems.

In various instances, the system 200 can comprise a resonator 202. In various aspects, the resonator 202 can be any suitable fixed-frequency microwave resonator used in quantum computing systems (e.g., a bus resonator). In various aspects, the resonator 202 can be any suitable λ/4 resonator. In various instances, the resonator 202 can be a long, low-frequency λ/4 resonator.

As shown, the resonator 202 can, in various embodiments, have a first end 204 and a second end 206. In various instances, the first end 204 of the resonator 202 can be capacitively coupled to the first qubit 102 and can be capacitively coupled to the second qubit 104. Specifically, in various aspects, the first end 204 of the resonator 202 can couple to the coupling capacitor 208 of the first qubit 102. Additionally, the first end 204 of the resonator 202 can also couple to the coupling capacitor 210 of the second qubit 104. In various instances, the second end 206 of the resonator 202 can be coupled and/or shorted to ground 212.

In various embodiments, the resonator 202 can have a first harmonic frequency. In various cases, the first harmonic frequency can be less than the first operational frequency of the first qubit 102. In various instances, the first harmonic frequency can also be less than the second operational frequency of the second qubit 104. In various embodiments, the resonator 202 can have a second harmonic frequency. In various cases, the second harmonic frequency can be greater than the first operational frequency of the first qubit 102. In various instances, the second harmonic frequency can also be greater than the second operational frequency of the second qubit 104. In various embodiments, the first harmonic frequency can be about 2 GHz (e.g., the first harmonic frequency can be within any suitable measurement resolution and/or measurement error of 2 GHz). In various instances, the second harmonic frequency can be about 6 GHz (e.g., the second harmonic frequency can be within any suitable measurement resolution and/or measurement error of 6 GHz). In other words, the system 200 can have a single resonant element (e.g., the resonator 202) and yet can have two resonances (e.g., the first harmonic frequency and the second harmonic frequency).

In various instances, the resonator 202, the ground 212, and the coupling capacitors 208 and 210 can be considered as a multi-resonant coupling architecture 214. As explained above, the multi-resonant coupling architecture 214 can reduce ZZ interaction between the first qubit 102 and the second qubit 104 without correspondingly decreasing the ZX interaction (e.g., exchange coupling J) between the first qubit 102 and the second qubit 104. Moreover, the multi-resonant coupling architecture 214 does not require the injection of many-pulse echoes into the system 200. Furthermore, the multi-resonant coupling architecture 214 can be constructed without tunable-frequency elements (e.g., the resonator 202 can be a fixed-frequency microwave resonator). Thus, the multi-resonant coupling architecture 214 can, in various aspects, reduce ZZ interaction between the first qubit 102 and the second qubit 104 without correspondingly degrading coherence times of the system 200. Thus, the multi-resonant coupling architecture 214 can constitute a concrete and tangible technical improvement over conventional systems and/or techniques.

Figure 3:
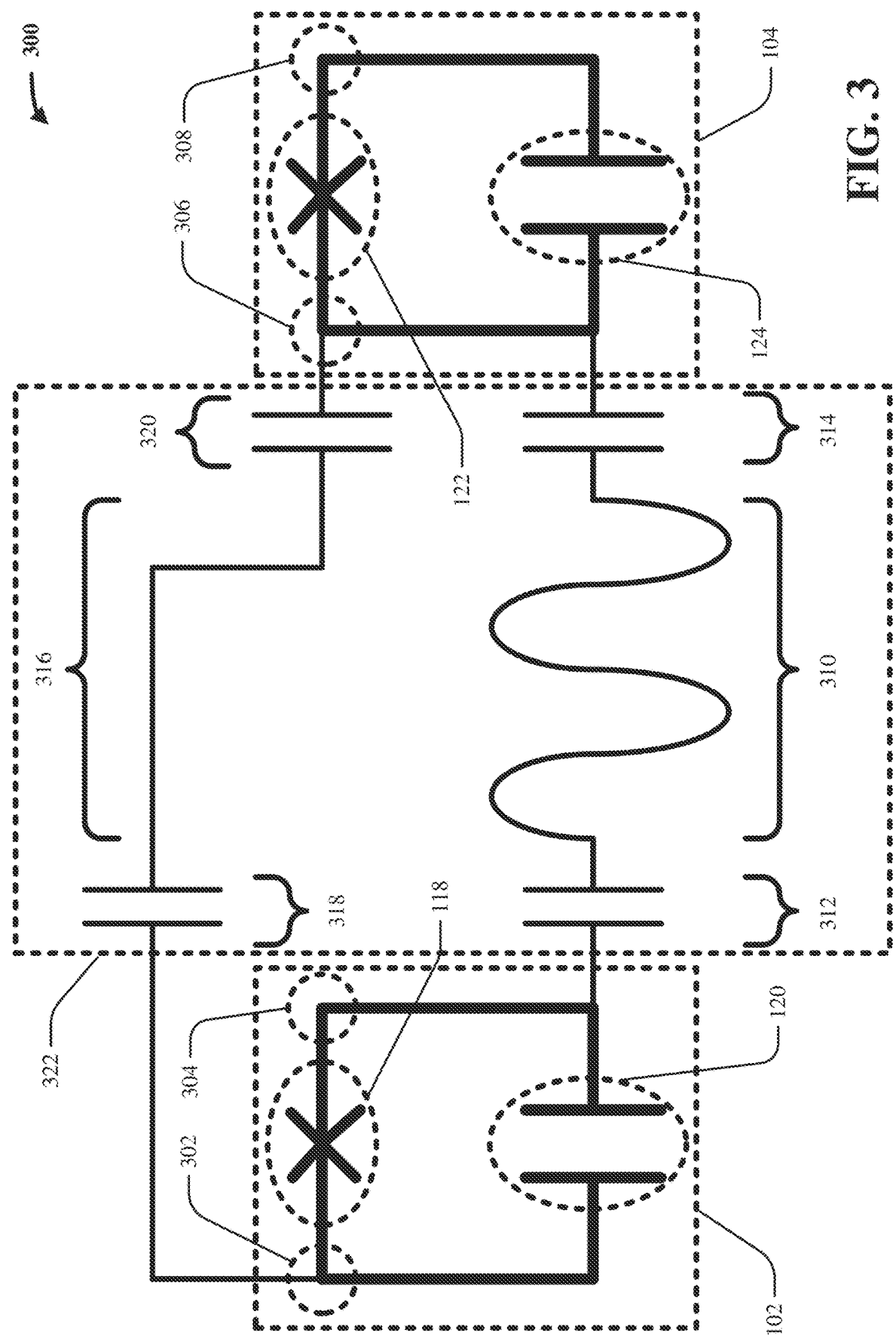
FIG. 3 illustrates a block diagram of an example, non-limiting system including a resonator and a differential direct coupler that facilitates ZZ interaction reduction in accordance with one or more embodiments described herein.

FIG. 3 illustrates a block diagram of an example, non-limiting system 300 including a resonator and a differential direct coupler that can facilitate ZZ interaction reduction in accordance with one or more embodiments described herein. As shown, in various aspects, the system 300 can comprise the first qubit 102 and the second qubit 104, substantially as described above.

As shown, in various embodiments, the first qubit 102 can have a first coupling capacitor 312 and can have a second coupling capacitor 318. Similarly, the second qubit 104 can have a first coupling capacitor 314 and can have a second coupling capacitor 320. In various instances, the coupling capacitors 312, 314, 318, and 320 can be any suitable coupling capacitors used in quantum computing systems.

Moreover, in various instances, the first qubit 102 can have a first pad/node 302 and can have a second pad/node 304. Similarly, the second qubit 104 can have a first pad/node 306 and can have a second pad/node 308. In various embodiments, the first pad/node 302 of the first qubit 102 can be considered to be common with the second pad/node 308 of the second qubit 104 (e.g., common qubit pads and/or nodes). Moreover, the first pad/node 302 of the first qubit 102 can be considered to be opposite of the first pad/node 306 of the second qubit 104 (e.g., opposite qubit pads and/or nodes). Similarly, in various instances, the second pad/node 304 of the first qubit 102 can be considered to be common with the first pad/node 306 of the second qubit 104 (e.g., common qubit pads and/or nodes). Additionally, the second pad/node 304 of the first qubit 102 can be considered to be opposite of the second pad/node 308 of the second qubit 104 (e.g., opposite qubit pads and/or nodes).

In various instances, the system 300 can comprise a resonator 310 and a differential direct coupler 316. In various aspects, the resonator 310 can be any suitable fixed-frequency microwave resonator used in quantum computing systems (e.g., a bus resonator). In various aspects, the resonator 310 can be any suitable $\lambda/2$ resonator. In various instances, the differential direct coupler 316 can be any suitable direct coupling and/or wiring used in quantum computing systems.

As shown, the resonator 310 can, in various embodiments, capacitively couple the first qubit 102 to the second qubit 104. Specifically, in various instances, the resonator 310 can have a first end (e.g., the left-hand end of the resonator 310 as depicted in FIG. 3) and a second end (e.g., the right-hand end of the resonator 310 as depicted in FIG. 3). In various cases, the first end of the resonator 310 can be coupled to the first coupling capacitor 312 of the first qubit 102. In various aspects, the second end of the resonator 310 can be coupled to the first coupling capacitor 314 of the second qubit 104. Similarly, the differential direct coupler 316 can, in various embodiments, capacitively couple to the first qubit 102 to the second qubit 104. Specifically, in various instances, the differential direct coupler 316 can have a first end (e.g., the left-hand end of the differential direct coupler 316 as depicted in FIG. 3) and a second end (e.g., the right-hand end of the differential direct coupler 316 as depicted in FIG. 3). In various cases, the first end of the differential direct coupler 316 can be coupled to the second coupling capacitor 318 of the first qubit 102. In various aspects, the second end of the differential direct coupler 316 can be coupled to the second coupling capacitor 320 of the second qubit 104. As shown, in various instances, the second coupling capacitor 318 of the first qubit 102 can be coupled to the first pad/node 302 of the first qubit 102. As also shown, the second coupling capacitor 320 of the second qubit 104 can be coupled to the first pad/node 306 of the second qubit 104. Thus, in various embodiments, the differential direct coupler 316 can be considered as capacitively coupling together opposite pads/nodes of the first qubit 102 and the second qubit 104 (e.g., the differential direct coupler 316 ultimately couples the first pad/node 302 of the first qubit 102 to the first pad/node 306 of the second qubit 104, where the first pad/node 302 of the first qubit 102 is considered to be opposite of the first pad/node 306 of the second qubit 104).

As shown, in various instances, the resonator 310 and the differential direct coupler 316 can be in parallel (e.g., as opposed to in series).

In various embodiments, the resonator 310 can have a resonant frequency. In various cases, the resonant frequency can be greater than the first operational frequency of the first qubit 102. In various instances, the resonant frequency can also be greater than the second operational frequency of the second qubit 104. In various embodiments, the resonant frequency can be about 6 GHz (e.g., the resonant frequency can be within any suitable measurement resolution and/or measurement error of 6 GHz). In various aspects, the differential direct coupler 316 can be any suitable, short section of transmission line (e.g., short in the sense that its resonance frequency is greater than about 30 GHz), which can give rise to a frequency-independent coupling at typical transmon qubit frequencies of around 5 GHz.

In various instances, the resonator 310, the differential direct coupler 316, and the coupling capacitors 312, 314, 318, and 320 can be considered as a multi-resonant coupling architecture 322. As explained above, the multi-resonant coupling architecture 322 can reduce ZZ interaction between the first qubit 102 and the second qubit 104 without correspondingly decreasing the ZX interaction (e.g., exchange coupling J) between the first qubit 102 and the second qubit 104. Moreover, the multi-resonant coupling architecture 322 does not require the injection of many-pulse echoes into the system 300. Furthermore, the multi-resonant coupling architecture 322 can be constructed without tunable-frequency elements (e.g., the resonator 310 can be a fixed-frequency microwave resonator, and the differential direct coupler 316 can be any suitable, short section of transmission line (e.g., short in the sense that its resonance frequency is greater than about 30 GHz), which can give rise to a frequency-independent coupling at typical transmon qubit frequencies of around 5 GHz, or can be considered as a non-resonant structure). Thus, the multi-resonant coupling architecture 322 can, in various aspects, reduce ZZ interaction between the first qubit 102 and the second qubit 104 without correspondingly degrading coherence times of the system 300. Moreover, in various embodiments, the differential direct coupler 316 can be a short and/or compact direct coupler, and the resonator 310 can be a short microwave resonator (e.g., a microwave resonator that can generate a high resonant frequency like 6 GHz can be shorter and/or more compact than a microwave resonator that can generate a low resonant frequency like 3 GHz). Thus, in various instances, the multi-resonant coupling architecture 322 can be very compact (and thus amenable to scaling to large device sizes), as compared to conventional systems and/or techniques. Thus, the multi-resonant coupling architecture 322 can constitute a concrete and tangible technical improvement over conventional systems and/or techniques.

Figure 4:
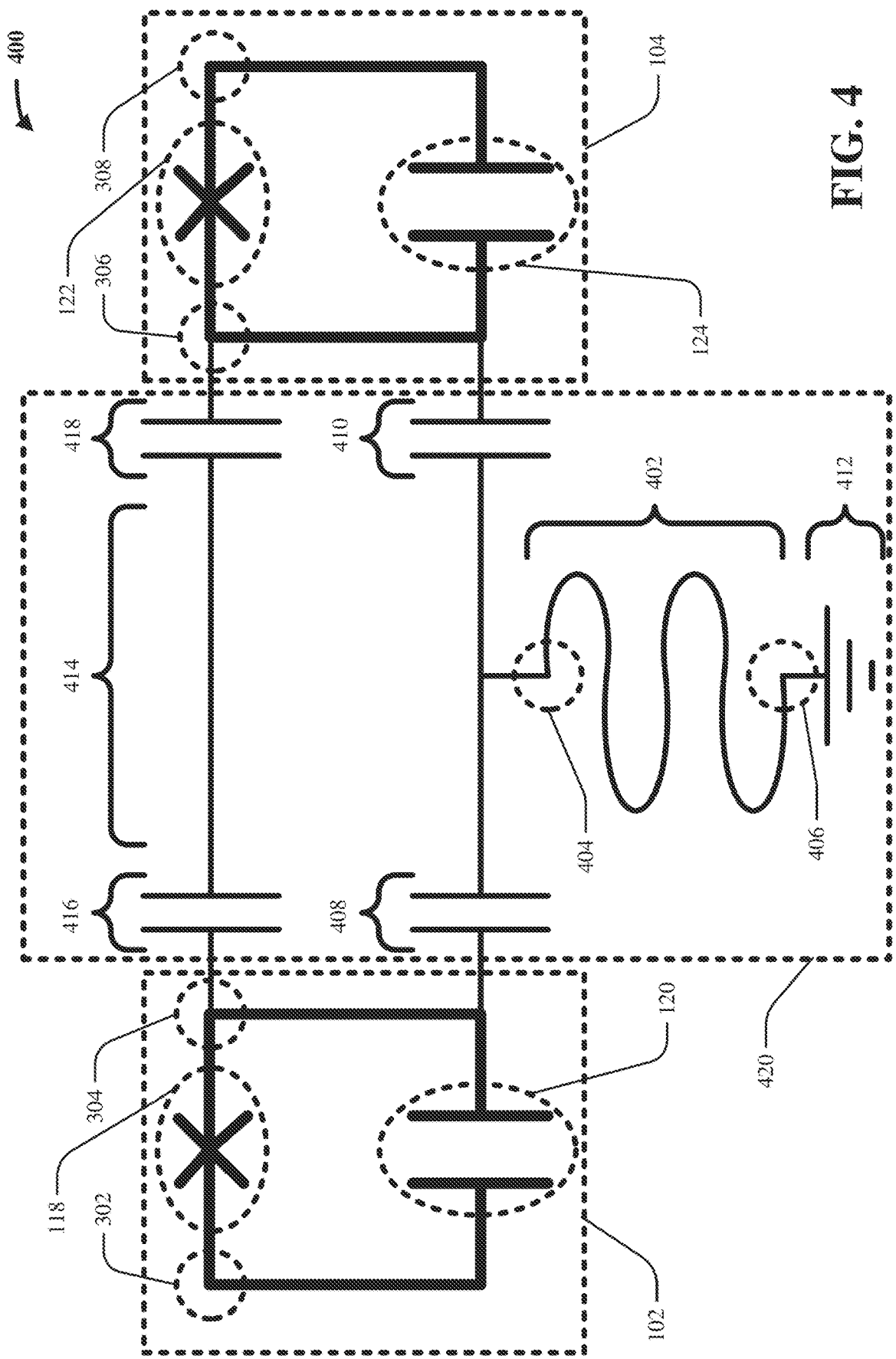
FIG. 4 illustrates a block diagram of an example, non-limiting system including a resonator and a direct coupler that facilitates ZZ interaction reduction in accordance with one or more embodiments described herein.

FIG. 4 illustrates a block diagram of an example, non-limiting system 400 including a resonator and a direct coupler that can facilitate ZZ interaction reduction in accordance with one or more embodiments described herein. As shown, in various aspects, the system 400 can comprise the first qubit 102 and the second qubit 104, substantially as described above.

As shown, in various embodiments, the first qubit 102 can have a first coupling capacitor 408 and can have a second coupling capacitor 416. Similarly, the second qubit 104 can have a first coupling capacitor 410 and can have a second coupling capacitor 418. In various instances, the coupling capacitors 408, 410, 416, and 418 can be any suitable coupling capacitors used in quantum computing systems.

Moreover, in various instances, the first qubit 102 can have the first pad/node 302 and can have a second pad/node 304, substantially as described above. Similarly, the second qubit 104 can have a first pad/node 306 and can have a second pad/node 308, substantially as described above. As explained above, in various embodiments, the first pad/node 302 of the first qubit 102 can be considered to be common with the second pad/node 308 of the second qubit 104 (e.g., common qubit pads and/or nodes). Moreover, the first pad/node 302 of the first qubit 102 can be considered to be opposite of the first pad/node 306 of the second qubit 104 (e.g., opposite qubit pads and/or nodes). Similarly, in various instances, the second pad/node 304 of the first qubit 102 can be considered to be common with the first pad/node 306 of the second qubit 104 (e.g., common qubit pads and/or nodes). Additionally, the second pad/node 304 of the first qubit 102 can be considered to be opposite of the second pad/node 308 of the second qubit 104 (e.g., opposite qubit pads and/or nodes).

In various instances, the system 400 can comprise a resonator 402 and a direct coupler 414. In various aspects, the resonator 402 can be any suitable fixed-frequency microwave resonator used in quantum computing systems (e.g., a bus resonator). In various aspects, the resonator 402 can be any suitable $\lambda/4$ resonator. In various instances, the direct coupler 414 can be any suitable direct coupling and/or wiring used in quantum computing systems.

As shown, the resonator 402 can, in various embodiments, have a first end 404 and can have a second end 406. In various cases, the first end 404 of the resonator 402 can be capacitively coupled to the first qubit 102 and can be capacitively coupled to the second qubit 104. Specifically, in various instances, the first end 404 of the resonator 402 can be coupled to the first coupling capacitor 408 of the first qubit 102. Additionally, in various aspects, the first end 404 of the resonator 402 can also be coupled to the first coupling capacitor 410 of the second qubit 104. In various instances, the second end 406 of the resonator 402 can be coupled and/or shorted to ground 412.

In various embodiments, the direct coupler 414 can capacitively couple the first qubit 102 to the second qubit 104. Specifically, in various instances, the direct coupler 414 can have a first end (e.g., the left-hand end of the direct coupler 414 as depicted in FIG. 4) and a second end (e.g., the right-hand end of the direct coupler 414 as depicted in FIG. 4). In various cases, the first end of the direct coupler 414 can be coupled to the second coupling capacitor 416 of the first qubit 102. In various aspects, the second end of the direct coupler 414 can be coupled to the second coupling capacitor 418 of the second qubit 104. As shown, in various instances, the second coupling capacitor 416 of the first qubit 102 can be coupled to the second pad/node 304 of the first qubit 102. As also shown, the second coupling capacitor 418 of the second qubit 104 can be coupled to the first pad/node 306 of the second qubit 104. Thus, in various embodiments, the direct coupler 414 can be considered as capacitively coupling together common pads/nodes of the first qubit 102 and the second qubit 104 (e.g., the direct coupler 414 ultimately couples the second pad/node 304 of the first qubit 102 to the first pad/node 306 of the second qubit 104, where the second pad/node 304 of the first qubit 102 is considered to be common with the first pad/node 306 of the second qubit 104).

In various embodiments, the resonator 402 can have a resonant frequency. In various cases, the resonant frequency can be greater than the first operational frequency of the first qubit 102. In various instances, the resonant frequency can also be greater than the second operational frequency of the second qubit 104. In various embodiments, the resonant frequency can be about 6 GHz (e.g., the resonant frequency can be within any suitable measurement resolution and/or measurement error of 6 GHz). In various aspects, the direct coupler 414 can be any suitable, short section of transmission line (e.g., short in the sense that its resonance frequency is greater than about 30 GHz), which can give rise to a frequency-independent coupling at typical transmon qubit frequencies of around 5 GHz.

In various instances, the resonator 402, the direct coupler 414, the ground 412, and the coupling capacitors 408, 410, 416, and 418 can be considered as a multi-resonant coupling architecture 420. As explained above, the multi-resonant coupling architecture 420 can reduce ZZ interaction between the first qubit 102 and the second qubit 104 without correspondingly decreasing the ZX interaction (e.g., exchange coupling J) between the first qubit 102 and the second qubit 104. Moreover, the multi-resonant coupling architecture 420 does not require the injection of many-pulse echoes into the system 400. Furthermore, the multi-resonant coupling architecture 420 can be constructed without tunable-frequency elements (e.g., the resonator 402 can be a fixed-frequency microwave resonator, and the direct coupler 414 can be any suitable, short section of transmission line (e.g., short in the sense that its resonance frequency is greater than about 30 GHz), which can give rise to a frequency-independent coupling at typical transmon qubit frequencies of around 5 GHz, or can be considered as a non-resonant structure). Thus, the multi-resonant coupling architecture 420 can, in various aspects, reduce ZZ interaction between the first qubit 102 and the second qubit 104 without correspondingly degrading coherence times of the system 400. Moreover, in various embodiments, the direct coupler 414 can be a short and/or compact direct coupler, and the resonator 402 can be a short microwave resonator (e.g., a microwave resonator that can have a high resonator frequency like 6 GHz can be shorter and/or more compact than a microwave resonator that can have a low resonant frequency like 2 GHz). Thus, in various instances, the multi-resonant coupling architecture 420 can be very compact (and thus amenable to scaling to large device sizes), as compared to conventional systems and/or techniques. Thus, the multi-resonant coupling architecture 420 can constitute a concrete and tangible technical improvement over conventional systems and/or techniques.

Figure 5:
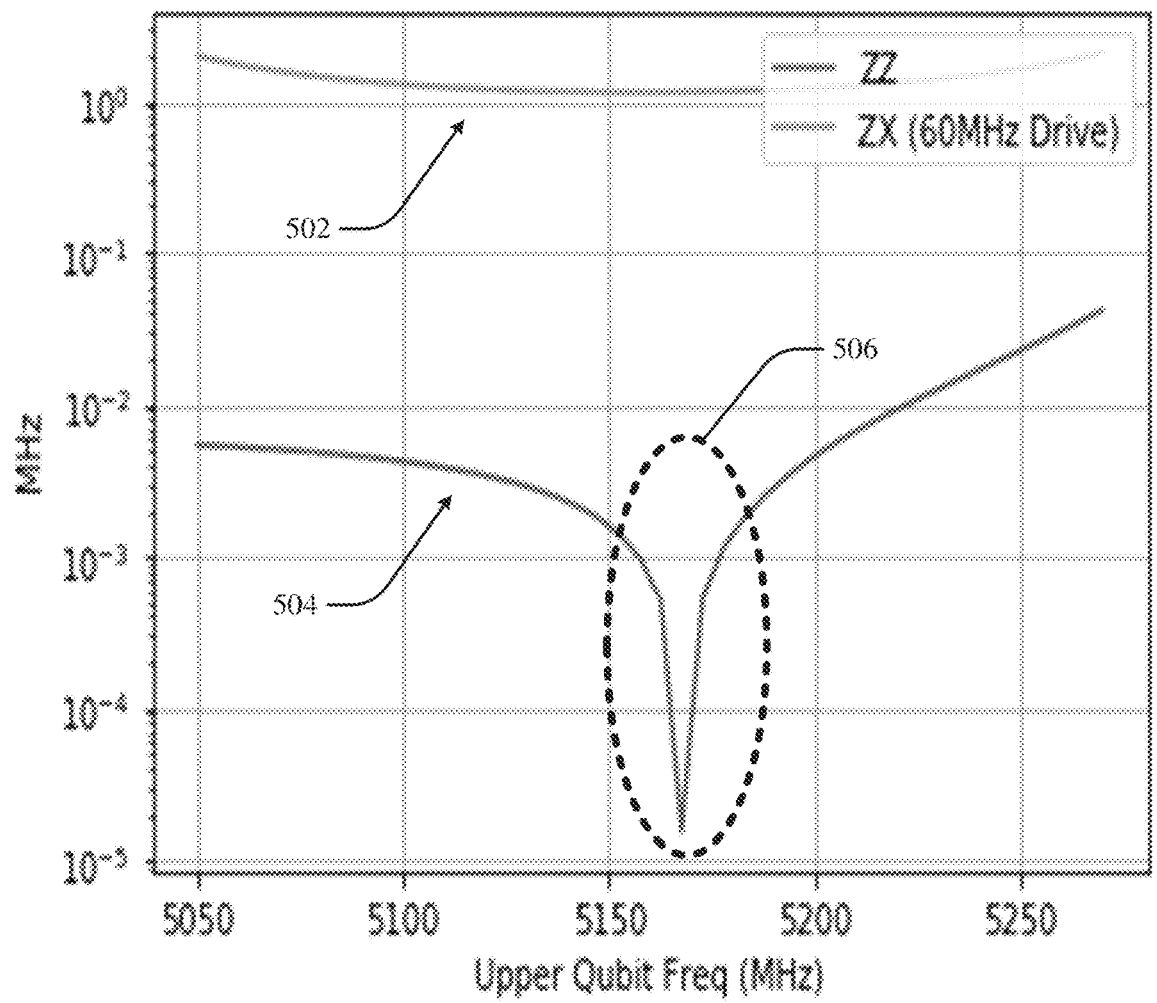
FIGS. 5-6 illustrate example, non-limiting graphs that depict the ZZ interaction reduction facilitated by one or more embodiments described herein.
Figure 6:
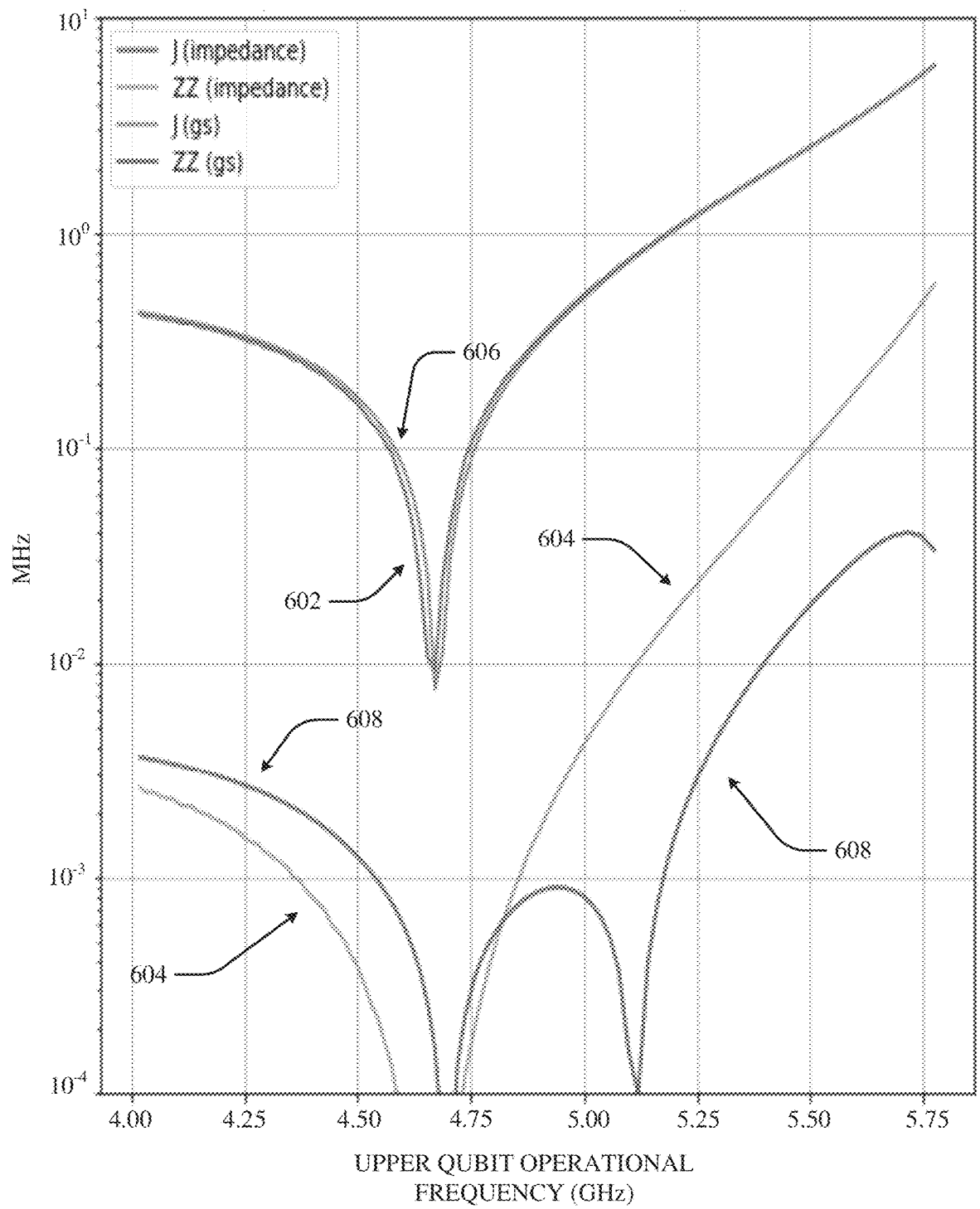

FIGS. 5-6 illustrate example, non-limiting graphs 500 and 600 that depict the ZZ interaction reduction facilitated by one or more embodiments described herein.

As shown in FIGS. 5-6, the graph 500 depicts computational simulation results of various embodiments of the invention, and the graph 600 depicts computational simulation results of various embodiments of the invention as compared to computational simulation results of conventional qubit coupling techniques. The inventors of various embodiments of the invention ran these computational simulations to calculate and/or approximate the ZX interaction (e.g., coupling strength and/or exchange coupling J) between two fixed-frequency superconducting qubits and to calculate and/or approximate the ZZ interaction between the two fixed-frequency superconducting qubits. In some of the simulations, the inventors assumed that the two fixed-frequency superconducting qubits were conventionally coupled. In other of the simulations, the inventors assumed that the two fixed-frequency superconducting qubits were coupled via a multi-resonant coupling architecture such as the multi-resonant coupling architecture 420. For these simulations, the inventors used the following values: g=80 MHz wherein g denotes the coupling strength between the transmon qubit and the bus resonator, $f_0$=5000 MHz where $f_0$ denotes the frequency of the upper transmon qubit, α=−320 MHz where α denotes the transmon qubit anharmonicity, ω=6100 MHz where ω denotes the bus resonator frequency, and $J_0$=4.5 MHz where $J_0$ denotes the transmon direct coupler exchange interaction. Moreover, the frequency separation between the two fixed-frequency superconducting qubits was set at 150 MHz. In various aspects, the simulations were run with a drive signal set at 60 MHz.

The graph 500 depicts a subset of the simulation results for various embodiments of the multi-resonant coupling architecture 420. As shown, the graph 500 includes a line 502 indicating and/or corresponding to the value of the ZX interaction between the two qubits as a function of the upper qubit operational frequency when the qubits are coupled by the multi-resonant coupling architecture 420. That is, the line 502 corresponds to the variable "ZX (60 MHz Drive)" as noted in the legend of FIG. 5. Also as shown, the graph 500 includes a line 504 indicating and/or corresponding to the value of the ZZ interaction between the two qubits as a function of the upper qubit operational frequency when the qubits are coupled by the multi-resonant coupling architecture 420. That is, the line 504 corresponds to the variable "ZZ" as noted in the legend of FIG. 5. As indicated by numeral 506, there is a particular range of upper qubit operational frequencies (e.g., between 5150 MHz and 5200 MHz) where the ZZ interaction significantly drops (e.g., a zero ZZ interaction) and where the ZX interaction does not significantly drop (e.g., a non-zero ZX interaction). In other words, the graph 500 illustrates a particular frequency band in which various embodiments of the invention cause a significant reduction in ZZ interaction without causing a corresponding reduction in ZX interaction. This drop in the ZZ interaction without a corresponding drop in the ZX interaction is facilitated by various embodiments of the invention. Moreover, since various embodiments of the invention do not require echoing and/or tunable-frequency elements, various embodiments of the invention can facilitate such ZZ reduction without the corresponding coherence degradation that normally accompanies conventional systems and/or techniques.

The graph 600 is similar to the graph 500, in that the graph 600 depicts the simulation results for various embodiments of the multi-resonant coupling architecture 420. However, the graph 600 depicts such results over a larger frequency band (e.g., from an upper qubit operational frequency of 4 GHz to 5.75 GHz) and also includes the results associated with conventional coupling techniques. As shown, the graph 600 includes a line 602 that indicates and/or corresponds to the value of the ZX interaction between the two qubits as a function of the upper qubit operational frequency when the qubits are conventionally coupled. That is, the line 602 corresponds to the variable "J (impedance)" as noted in the legend of FIG. 6. The graph 600 also includes a line 604 that indicates and/or corresponds to the value of the ZZ interaction between the two qubits as a function of the upper qubit operation frequency when the two qubits are conventionally coupled. That is, the line 604 corresponds to the variable "ZZ (impedance)" as noted in the legend of FIG. 6. As shown, conventional coupling techniques can cause both the ZX interaction and the ZZ interaction to significantly decrease in a particular frequency band (e.g., between 4.5 GHz and 4.75 GHz). However, as shown, there is no frequency band in which the conventional coupling techniques cause the ZZ interaction to significantly drop without a corresponding drop in the ZX interaction. As shown, conventional coupling techniques yield a low ZZ interaction only in operating points where the ZX interaction is also weak. However, as shown, various embodiments of the invention can yield operating points where the ZZ interaction is weak despite a nonzero and/or non-weak ZX interaction.

As shown, the graph 600 includes a line 606 that indicates and/or corresponds to the value of the ZX interaction between the two qubits as a function of the upper qubit operational frequency when the qubits are coupled by the multi-resonant coupling architecture 420. That is, the line 606 corresponds to the variable "J (gs)" as noted in the legend of FIG. 6. Additionally, the graph 600 includes a line 608 that indicates and/or corresponds to the value of the ZZ interaction between the two qubits as a function of the upper qubit operational frequency when the qubits are coupled by the multi-resonant coupling architecture 420. That is, the line 608 corresponds to the variable "ZZ (gs)" as noted in the legend of FIG. 6. As shown, various embodiments of the multi-resonant coupling architecture 420 can cause both the ZX interaction and the ZZ interaction to significantly decrease in a particular frequency band (e.g., between 4.5 GHz and 4.75 GHz). Also as shown, various embodiments of the multi-resonant coupling architecture 420 can cause the ZZ interaction to significantly decrease without a corresponding decrease in the ZX interaction in a different frequency band (e.g., between 5 GHz and 5.25 GHz).

These results can be compared to demonstrate the benefits of various embodiments of the invention over conventional systems and/or techniques. As shown, the line 606 is nearly identical to the line 602. In other words, the multi-resonant coupling architecture 420 can provide a nearly identical ZX interaction (e.g., a coupling strength and/or exchange coupling J) as conventional coupling techniques. However, as shown, the line 608 is significantly lower than the line 604 for a broad frequency band (e.g., from about 4.8 GHz to 5.75 GHz). Indeed, as shown in the graph 600, the line 608 is nearly a full order of magnitude below the line 604 from about 5 GHz to 5.75 GHz, and the line 608 is nearly two orders of magnitude below the line 604 in a narrow frequency band between 5 GHz and 5.25 GHz, as shown. Such improved performance clearly shows that various embodiments of the invention constitute concrete and tangible technical improvements over the prior art.

Note that the graphs 500 and 600 are exemplary and non-limiting. In various aspects, the zero ZZ interaction and the non-zero ZX interaction can occur in different upper qubit operational frequency than those depicted in FIGS. 5-6, based on various parameters corresponding to the multi-resonant coupling architecture that is used to couple the qubits and/or based on the operating environment of the coupled qubits (e.g., different resonant frequencies of the $\lambda/2$ and/or $\lambda/4$ couplers, different drive signals). Also, note that the graphs 500 and 600 show the particular simulation results for various embodiments of the multi-resonant coupling architecture 420. However, very similar simulation results were obtained by the inventors for the various other embodiments of the invention (e.g., for the multi-resonant coupling architectures 126, 214, and 322). Since the results were nearly identical, the other simulation results are omitted for sake of brevity.

Figure 7:
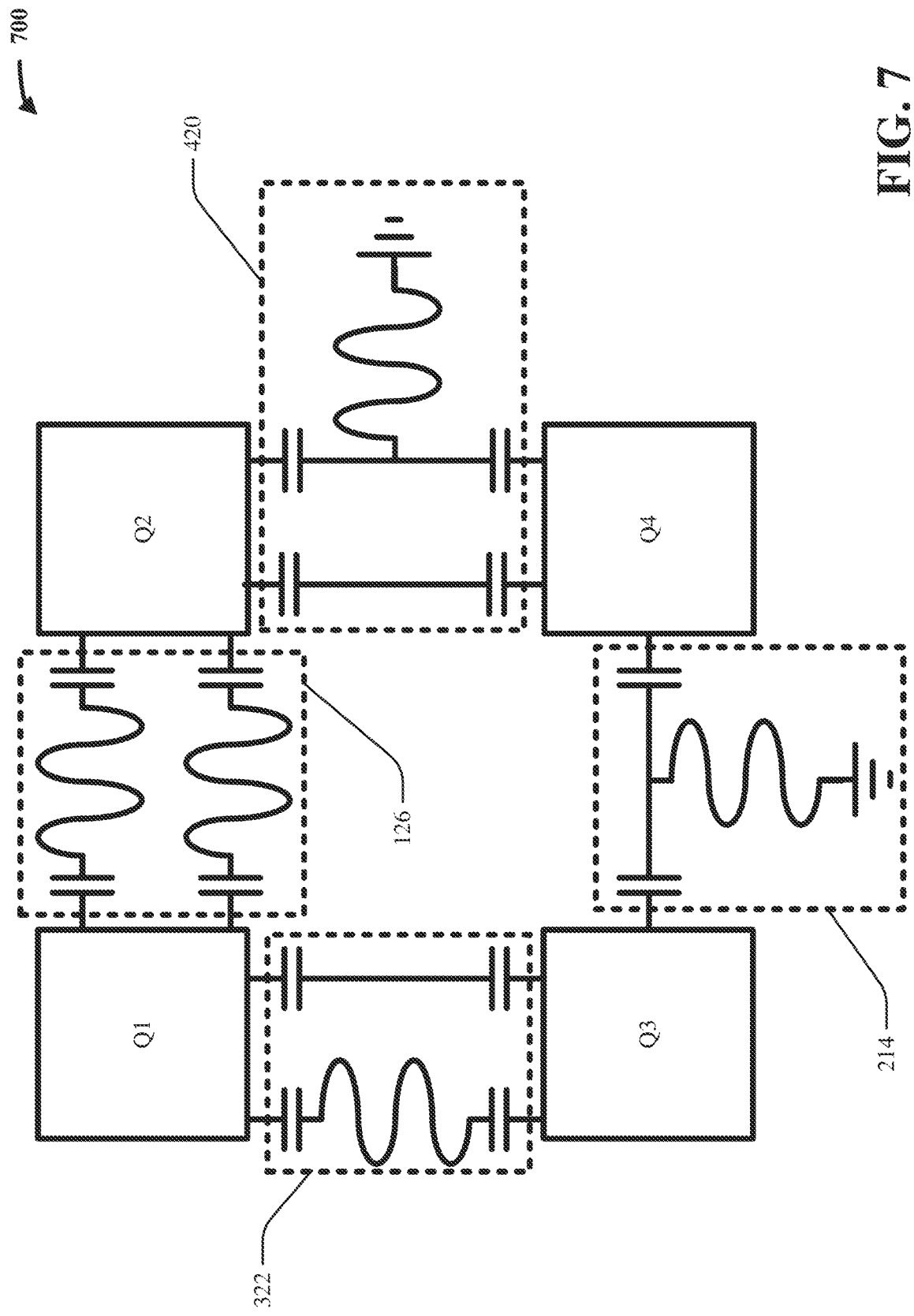
FIG. 7 illustrates a block diagram of an example, non-limiting qubit array that facilitates ZZ interaction reduction in accordance with one or more embodiments described herein.

FIG. 7 illustrates a block diagram of an example, non-limiting qubit array 700 that can facilitate ZZ interaction reduction in accordance with one or more embodiments described herein.

As shown in FIG. 7, various embodiments of the invention can be implemented to create a qubit array 700 (e.g., a two-dimensional array of coupled qubits). As shown, the qubit array 700 can, in various aspects, comprise the qubits Q1 to Q4. In various aspects, the qubits Q1 to Q4 can be any suitable types and/or combinations of types of superconducting qubits (e.g., the qubits Q1 to Q4 can be the same type of qubit, and/or can be different types of qubits). In various instances, the qubit array 700 can be a square and/or lattice array (e.g., two rows of two qubits). In various aspects, the qubit array 700 can be arranged in any other suitable configuration and/or shape (e.g., rectangle, triangle, circle). Although FIG. 7 depicts only four qubits (e.g., Q1 to Q4) in the qubit array 700, this is for illustration only. In various instances, any suitable number of qubits can be implemented in the qubit array 700. In various aspects, the qubits Q1 to Q4 can be arranged in the qubit array 700 on any suitable quantum computing substrate (not shown).

As shown, in various embodiments, any qubit in the qubit array 700 can be coupled to some and/or all of its nearest-neighbor qubits (and/or some and/or all of its next-nearest neighbor qubits, in some cases) by any suitable multi-resonant coupling architecture as described herein. For example, as shown, the qubit Q1 can be coupled to the qubit Q2 via a multi-resonant coupling architecture 126, as explained in relation to FIG. 1. As shown, the qubit Q1 can also be coupled to the qubit Q3 by a multi-resonant coupling architecture 322, as explained in relation to FIG. 3 (e.g., for the sake of illustrative simplicity, FIG. 7 does not illustrate the differential nature of the multi-resonant coupling architecture 322, however, such differential nature is amply depicted and described in relation to FIG. 3). As shown, the qubit Q2 can also be coupled to the qubit Q4 by a multi-resonant coupling architecture 420, as explained in relation to FIG. 4. As shown, the qubit Q3 can be coupled to the qubit Q4 by a multi-resonant coupling architecture 214, as explained in relation to FIG. 2. Although not illustrated in FIG. 7, one or more conventional couplers can also be implemented in the qubit array 700, in various instances.

In various aspects, FIG. 7 depicts a non-limiting example of how one or more of the multi-resonant coupling architectures depicted in FIGS. 1-4 (e.g., multi-resonant coupling architectures, 126, 214, 322, and 420) can be implemented to create two-dimensional arrays of coupled qubits with reduced ZZ interactions.

Figure 8:
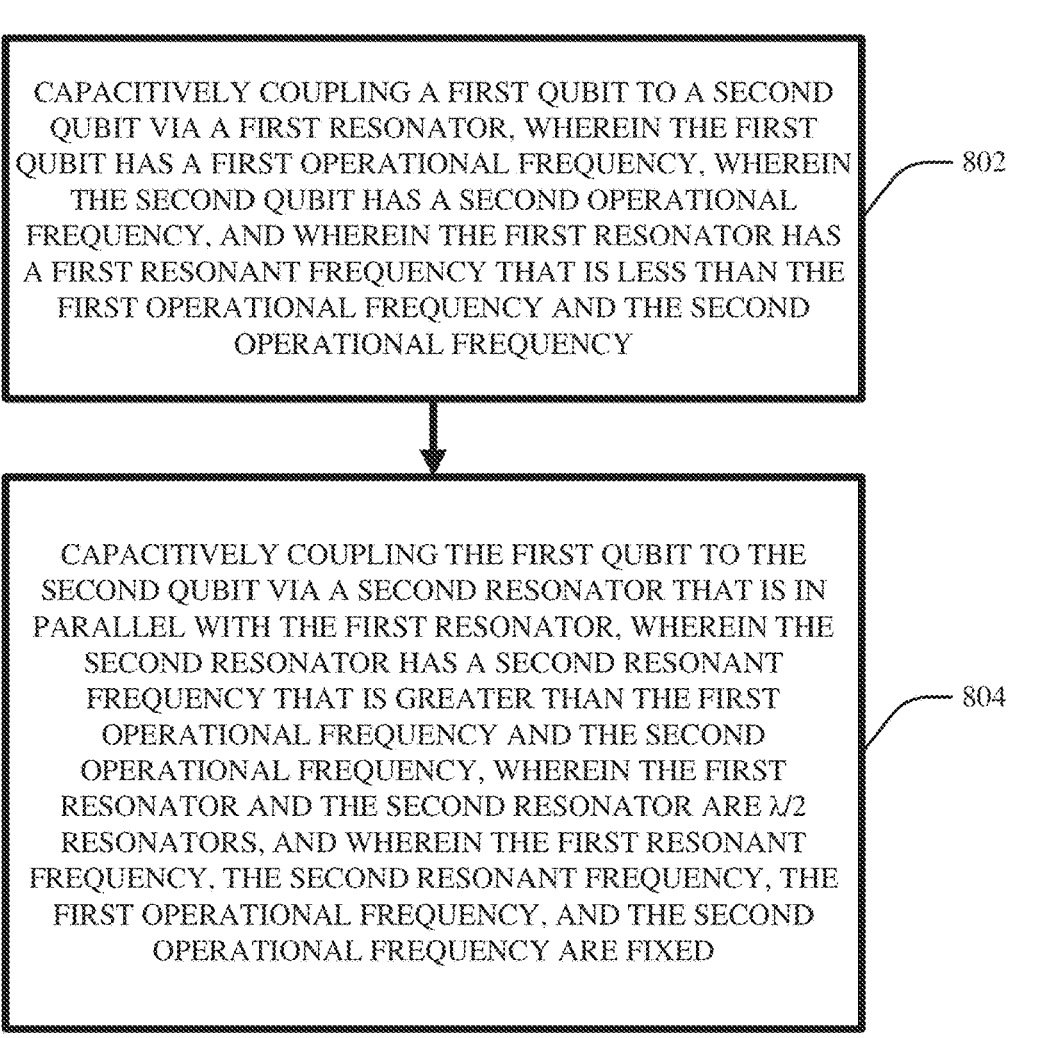
FIG. 8 illustrates a flow diagram of an example, non-limiting method including two resonators that facilitates ZZ interaction reduction in accordance with one or more embodiments described herein.

FIG. 8 illustrates a flow diagram of an example, non-limiting method 800 including two resonators that can facilitate ZZ interaction reduction in accordance with one or more embodiments described herein.

In various embodiments, act 802 can include capacitively coupling a first qubit (e.g., 102) to a second qubit (e.g., 104) via a first resonator (e.g., 106). In various instances, the first qubit can have a first operational frequency, and the second qubit can have a second operational frequency. In various aspects, the first resonator can have a first resonant frequency that is less than the first operational frequency and that is less than the second operational frequency.

In various instances, act 804 can include capacitively coupling the first qubit to the second qubit via a second resonator (e.g., 112) that is in parallel with the first resonator. In various instances, the second resonator can have a second resonant frequency that is greater than the first operational frequency and that is greater than the second operational frequency. In various aspects, the first resonator and the second resonator can be $\lambda/2$ resonators. In various instances, the first resonant frequency, the second resonant frequency, the first operational frequency, and the second operational frequency can be fixed.

Figure 9:
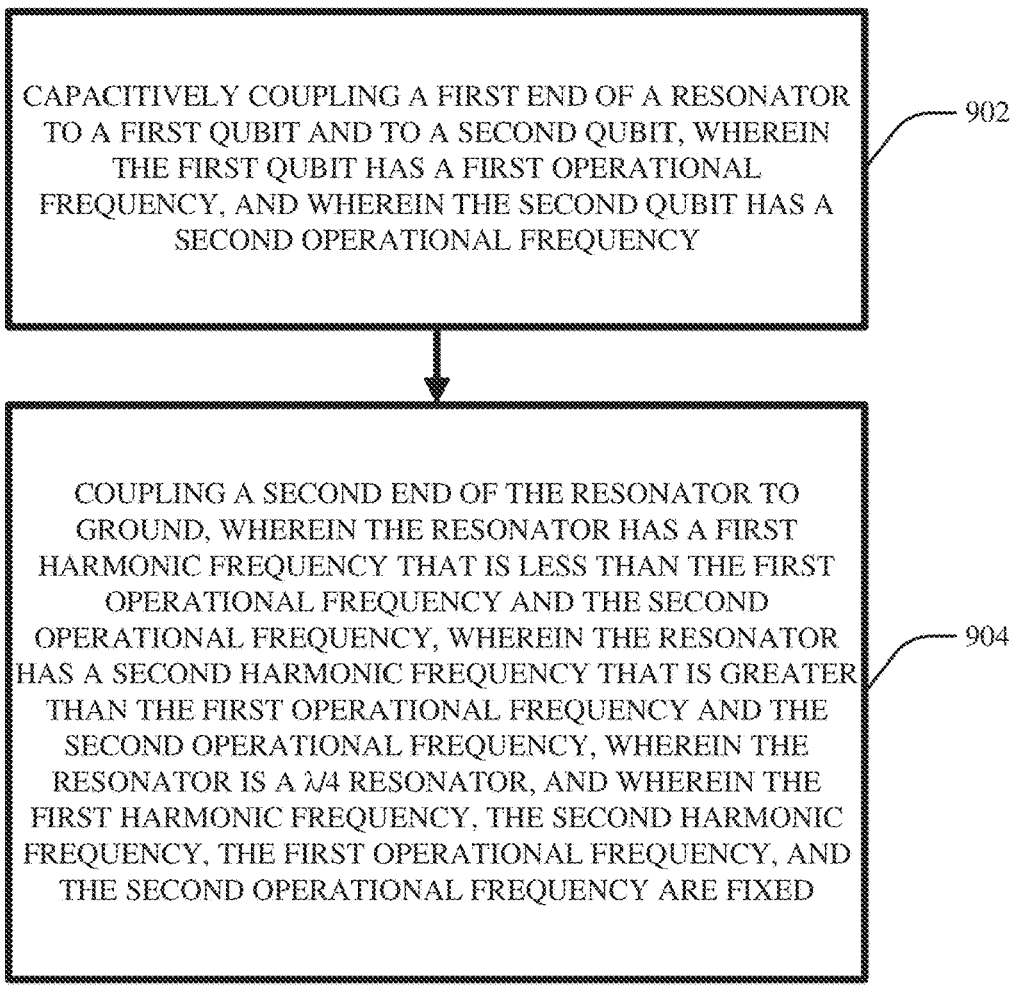
FIG. 9 illustrates a flow diagram of an example, non-limiting method including one resonator that facilitates ZZ interaction reduction in accordance with one or more embodiments described herein.

FIG. 9 illustrates a flow diagram of an example, non-limiting method 900 including one resonator that can facilitate ZZ interaction reduction in accordance with one or more embodiments described herein.

In various embodiments, act 902 can include capacitively coupling a first end (e.g., 204) of a resonator (e.g., 202) to a first qubit (e.g., 102) and to a second qubit (e.g., 104). In various instances, the first qubit can have a first operational frequency, and the second qubit can have a second operational frequency.

In various instances, act 904 can include coupling a second end (e.g., 206) of the resonator to ground (e.g., 212). In various instances, the resonator can have a first harmonic frequency that is less than the first operational frequency and that is less than the second operational frequency. In various aspects, the resonator can have a second harmonic frequency that is greater than the first operational frequency and that is greater than the second operational frequency. In various instances, the resonator can be a $\lambda/4$ resonator. In various instances, the first harmonic frequency, the second harmonic frequency, the first operational frequency, and the second operational frequency can be fixed.

Figure 10:
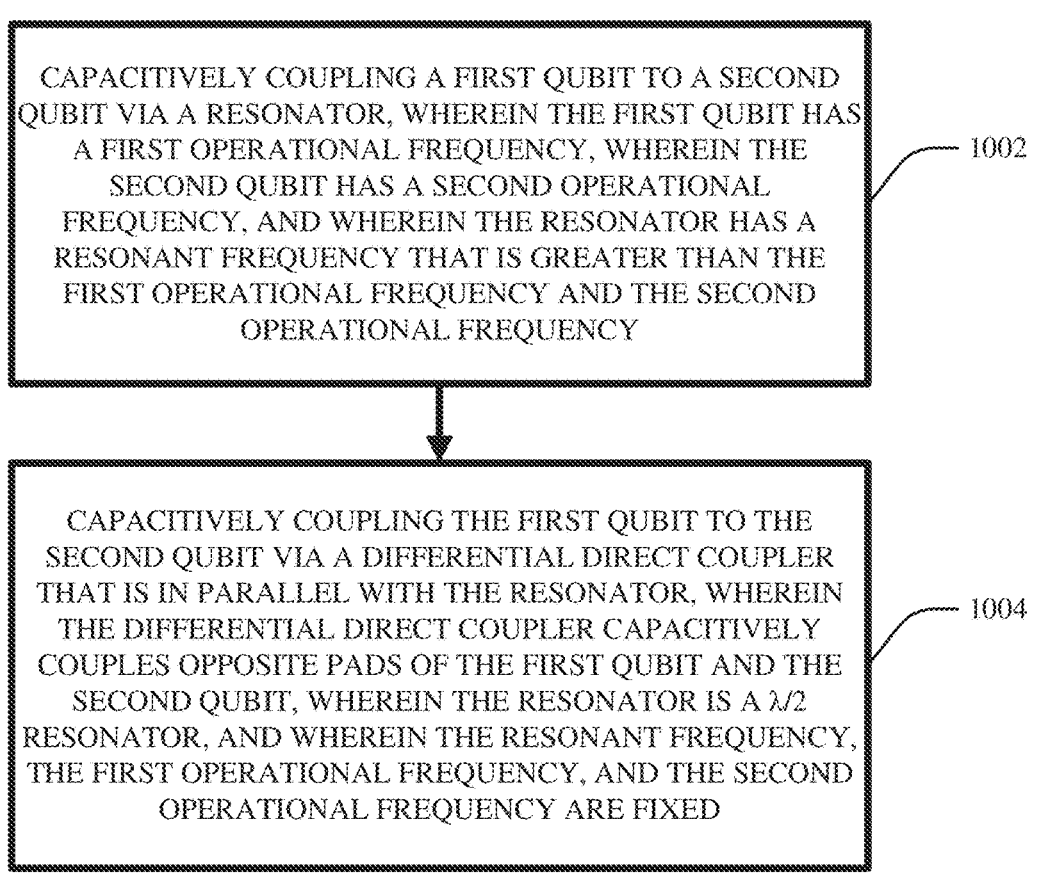
FIG. 10 illustrates a flow diagram of an example, non-limiting method including a resonator and a differential direct coupler that facilitates ZZ interaction reduction in accordance with one or more embodiments described herein.

FIG. 10 illustrates a flow diagram of an example, non-limiting method 1000 including a resonator and a differential direct coupler that can facilitate ZZ interaction reduction in accordance with one or more embodiments described herein.

In various embodiments, act 1002 can include capacitively coupling a first qubit (e.g., 102) to a second qubit (e.g., 104) via a resonator (e.g., 310). In various instances, the first qubit can have a first operational frequency, the second qubit can have a second operational frequency, and the resonator can have a resonant frequency that is greater than the first operational frequency and that is greater than the second operational frequency.

In various instances, act 1004 can include capacitively coupling the first qubit to the second qubit via a differential direct coupler (e.g., 316) that is in parallel with the resonator. In various instances, the differential direct coupler can capacitively couple opposite pads (e.g., 302 and 306) of the first qubit and the second qubit. In various cases, the resonator can be a $\lambda/2$ resonator. In various instances, the resonant frequency, the first operational frequency, and the second operational frequency can be fixed.

Figure 11:
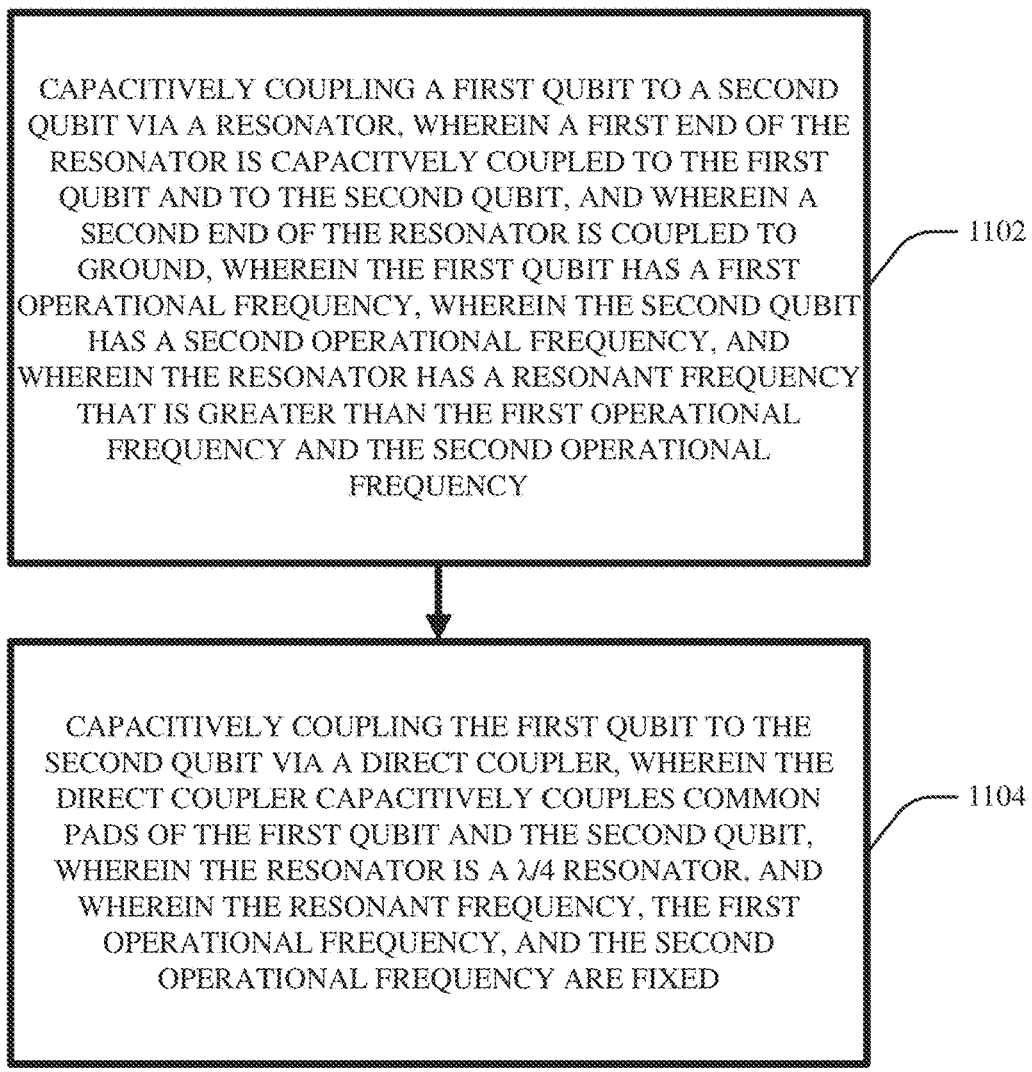
FIG. 11 illustrates a flow diagram of an example, non-limiting method including a resonator and a direct coupler that facilitates ZZ interaction reduction in accordance with one or more embodiments described herein.

FIG. 11 illustrates a flow diagram of an example, non-limiting method 1100 including a resonator and a direct coupler that can facilitate ZZ interaction reduction in accordance with one or more embodiments described herein.

In various embodiments, act 1102 can include capacitively coupling a first qubit (e.g., 102) to a second qubit (e.g., 104) via a resonator (e.g., 402). In various cases, a first end (e.g., 404) of the resonator can be capacitively coupled to the first qubit and to the second qubit, and a second end (e.g., 406) of the resonator can be coupled to ground (e.g., 412). In various cases, the first qubit can have a first operational frequency, the second qubit can have a second operational frequency, and the resonator can have a resonant frequency that is greater than the first operational frequency and that is greater than the second operational frequency.

In various instances, act 1104 can include capacitively coupling the first qubit to the second qubit via a direct coupler (e.g., 414). In various instances, the direct coupler can capacitively couple common pads (e.g., 304 and 306) of the first qubit and the second qubit. In various cases, the resonator can be a $\lambda/4$ resonator. In various instances, the resonant frequency, the first operational frequency, and the second operational frequency can be fixed.

FIG. 12 illustrates a flow diagram of an example, non-limiting method 1200 that can facilitate ZZ interaction reduction in accordance with one or more embodiments described herein.

In various embodiments, act 1202 can include capacitively coupling a first qubit (e.g., 102) to a second qubit (e.g., 104) via a non-tunable multi-resonant architecture (e.g., a coupling architecture as shown in FIGS. 1-4). In various instances, the multi-resonant architecture can include a first pole that is greater than both a first operational frequency of the first qubit and a second operational frequency of the second qubit (e.g., in FIG. 1, the second resonant frequency of the second resonator 112 can be the first pole; in FIG. 2, the second harmonic frequency of the resonator 202 can be the first pole; in FIG. 3, the resonant frequency of the resonator 310 can be the first pole; in FIG. 4, the resonant frequency of the resonator 402 can be the first pole). In various aspects, the multi-resonant architecture can include a second pole that is less than both the first operational frequency and the second operational frequency (e.g., in FIG. 1, the first resonant frequency of the first resonator 106 can be the second pole; in FIG. 2, the first harmonic frequency of the resonator 202 can be the second pole). In various other aspects, rather than the second pole, the multi-resonant architecture can instead include a direct coupling term (e.g., the differential direct coupler 316 in FIG. 3, or the direct coupler 414 in FIG. 4). In various cases, the multi-resonant architecture can exhibit a zero coupling strength and a zero ZZ interaction in a first set of qubit frequencies (e.g., between 4.5 GHz and 4.75 GHz as shown in FIG. 6). In various instances, the multi-resonant architecture can exhibit a non-zero coupling strength and a zero ZZ interaction in a second set of qubit frequencies (e.g., between 5 GHz and 5.25 GHz as shown in FIG. 6).

Various embodiments of the invention can reduce unwanted ZZ interactions while preserving desirable ZX interactions. In various instances, this can be accomplished by a multi-resonant coupling architecture that has two fixed-frequency elements. In various aspects, the detuning between the two fixed-frequency elements and the qubits can be different, which can facilitate the suppression of the ZZ interaction. In various other instances, this can be accomplished by a multi-element coupler that includes a resonator and a short capacitive coupler. In various instances, the two qubits' interactions with the elements can be different, which can, in certain frequency bands, result in cancellation of the undesired ZZ interaction.

In various instances, the following sample experiment can be conducted. Two qubits can be coupled together via any embodiment of the invention (e.g., via any multi-resonant coupling architecture discussed herein). The qubits can be weakly-tunable so that the parameters and/or performance of the multi-resonant coupling architecture can be investigated. For various combinations of pairs of qubit frequencies, the exchange coupling J and the ZZ interaction can be tested and/or recorded (e.g., J can be estimated from the ZX rate of cross-resonance; ZZ interaction can be measured by a Pi-Ramsey experiment). This can allow the ZZ cancellation points to be mapped out for a given coupler. Then, ac-Stark shifts can be employed to tune the weakly-tunable qubits into a desired regime. Finally, a cross-resonance gate can be operated with the qubits in the ZZ cancellation bandwidth.

In some cases, a multi-resonant coupling architecture can include two $\lambda/2$ resonators (e.g., as shown in FIG. 1), with one having a resonant frequency of 4 GHz and the other having a resonant frequency of 6 GHz.

In some cases, a multi-resonant coupling architecture can include a single $\lambda/4$ resonator (e.g., as shown in FIG. 2), having a first harmonic at 2 GHz and a second harmonic at 6 GHz, which can combine to reduce and/or suppress ZZ interactions.

In some cases, a multi-resonant coupling architecture can include a $\lambda/2$ resonator at 6 GHz and a direct capacitive connection between differential pads of the qubits (e.g., as shown in FIG. 3). In various instances, the couplings via the two paths can be balanced so that exchange coupling J approaches zero around an upper qubit operational frequency of 4.7 GHz, which can cause a zero ZZ interaction and a non-zero exchange coupling J at about 5 GHz.

In some cases, a multi-resonant coupling architecture can include a λ/4 resonator at 6 GHz and a direct capacitive connection between common pads of the qubits (e.g., as shown in FIG. 4).

Various embodiments of the invention can provide for a multi-resonant coupling architecture that can include one or more coupling elements whose frequency response results in a cancellation of state-dependent coupling at the qubit frequencies while maintaining a finite state-independent coupling.

Figure 13:
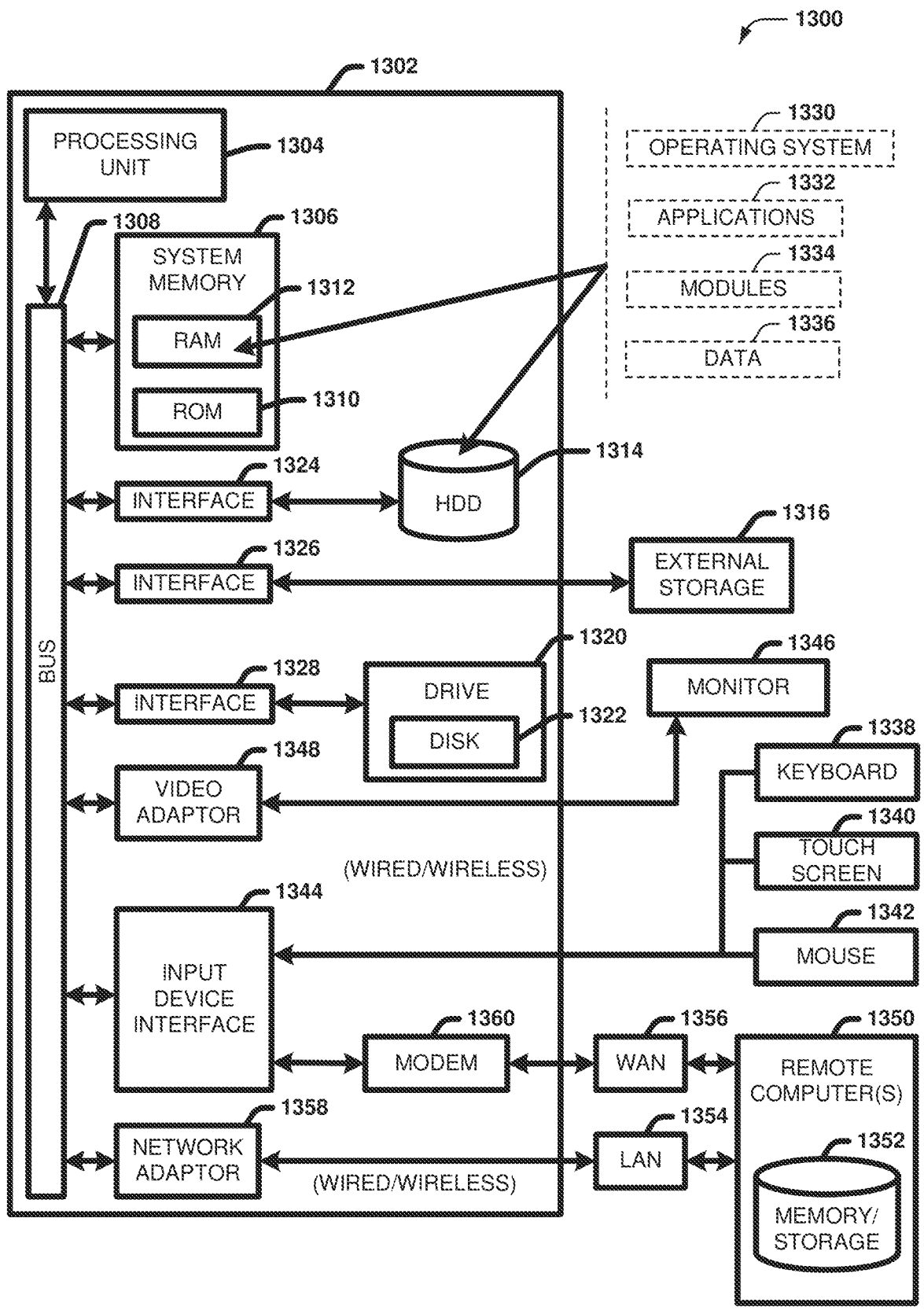
FIG. 13 illustrates a block diagram of an example, non-limiting operating environment in which one or more embodiments described herein can be facilitated.

In order to provide additional context for various embodiments described herein, FIG. 13 and the following discussion are intended to provide a general description of a suitable computing environment 1300 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 13, the example environment 1300 for implementing various embodiments of the aspects described herein includes a computer 1302, the computer 1302 including a processing unit 1304, a system memory 1306 and a system bus 1308. The system bus 1308 couples system components including, but not limited to, the system memory 1306 to the processing unit 1304. The processing unit 1304 can be any of various commercially available processors. Dual microprocessors and other multi-processor architectures can also be employed as the processing unit 1304.

The system bus 1308 can be any of several types of bus structure that can further interconnect to a memory bus (with or without a memory controller), a peripheral bus, and a local bus using any of a variety of commercially available bus architectures. The system memory 1306 includes ROM 1310 and RAM 1312. A basic input/output system (BIOS) can be stored in a non-volatile memory such as ROM, erasable programmable read only memory (EPROM), EEPROM, which BIOS contains the basic routines that help to transfer information between elements within the computer 1302, such as during startup. The RAM 1312 can also include a high-speed RAM such as static RAM for caching data.

The computer 1302 further includes an internal hard disk drive (HDD) 1314 (e.g., EIDE, SATA), one or more external storage devices 1316 (e.g., a magnetic floppy disk drive (FDD) 1316, a memory stick or flash drive reader, a memory card reader, etc.) and a drive 1320, e.g., such as a solid state drive, an optical disk drive, which can read or write from a disk 1322, such as a CD-ROM disc, a DVD, a BD, etc. Alternatively, where a solid state drive is involved, disk 1322 would not be included, unless separate. While the internal HDD 1314 is illustrated as located within the computer 1302, the internal HDD 1314 can also be configured for external use in a suitable chassis (not shown). Additionally, while not shown in environment 1300, a solid state drive (SSD) could be used in addition to, or in place of, an HDD 1314. The HDD 1314, external storage device(s) 1316 and drive 1320 can be connected to the system bus 1308 by an HDD interface 1324, an external storage interface 1326 and a drive interface 1328, respectively. The interface 1324 for external drive implementations can include at least one or both of Universal Serial Bus (USB) and Institute of Electrical and Electronics Engineers (IEEE)

1394 interface technologies. Other external drive connection technologies are within contemplation of the embodiments described herein.

The drives and their associated computer-readable storage media provide nonvolatile storage of data, data structures, computer-executable instructions, and so forth. For the computer 1302, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1312, including an operating system 1330, one or more application programs 1332, other program modules 1334 and program data 1336. All or portions of the operating system, applications, modules, and/or data can also be cached in the RAM 1312. The systems and methods described herein can be implemented utilizing various commercially available operating systems or combinations of operating systems.

Computer 1302 can optionally comprise emulation technologies. For example, a hypervisor (not shown) or other intermediary can emulate a hardware environment for operating system 1330, and the emulated hardware can optionally be different from the hardware illustrated in FIG. 13. In such an embodiment, operating system 1330 can comprise one virtual machine (VM) of multiple VMs hosted at computer 1302. Furthermore, operating system 1330 can provide runtime environments, such as the Java runtime environment or the .NET framework, for applications 1332. Runtime environments are consistent execution environments that allow applications 1332 to run on any operating system that includes the runtime environment. Similarly, operating system 1330 can support containers, and applications 1332 can be in the form of containers, which are lightweight, standalone, executable packages of software that include, e.g., code, runtime, system tools, system libraries and settings for an application.

Further, computer 1302 can be enable with a security module, such as a trusted processing module (TPM). For instance with a TPM, boot components hash next in time boot components, and wait for a match of results to secured values, before loading a next boot component. This process can take place at any layer in the code execution stack of computer 1302, e.g., applied at the application execution level or at the operating system (OS) kernel level, thereby enabling security at any level of code execution.

A user can enter commands and information into the computer 1302 through one or more wired/wireless input devices, e.g., a keyboard 1338, a touch screen 1340, and a pointing device, such as a mouse 1342. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1304 through an input device interface 1344 that can be coupled to the system bus 1308, but can be connected by other interfaces, such as a parallel port, an IEEE 1394 serial port, a game port, a USB port, an IR interface, a BLUETOOTH® interface, etc.

A monitor 1346 or other type of display device can be also connected to the system bus 1308 via an interface, such as a video adapter 1348. In addition to the monitor 1346, a computer typically includes other peripheral output devices (not shown), such as speakers, printers, etc.

The computer 1302 can operate in a networked environment using logical connections via wired and/or wireless communications to one or more remote computers, such as a remote computer(s) 1350. The remote computer(s) 1350 can be a workstation, a server computer, a router, a personal computer, portable computer, microprocessor-based entertainment appliance, a peer device or other common network node, and typically includes many or all of the elements described relative to the computer 1302, although, for purposes of brevity, only a memory/storage device 1352 is illustrated. The logical connections depicted include wired/wireless connectivity to a local area network (LAN) 1354 and/or larger networks, e.g., a wide area network (WAN) 1356. Such LAN and WAN networking environments are commonplace in offices and companies, and facilitate enterprise-wide computer networks, such as intranets, all of which can connect to a global communications network, e.g., the Internet.

When used in a LAN networking environment, the computer 1302 can be connected to the local network 1354 through a wired and/or wireless communication network interface or adapter 1358. The adapter 1358 can facilitate wired or wireless communication to the LAN 1354, which can also include a wireless access point (AP) disposed thereon for communicating with the adapter 1358 in a wireless mode.

When used in a WAN networking environment, the computer 1302 can include a modem 1360 or can be connected to a communications server on the WAN 1356 via other means for establishing communications over the WAN 1356, such as by way of the Internet. The modem 1360, which can be internal or external and a wired or wireless device, can be connected to the system bus 1308 via the input device interface 1344. In a networked environment, program modules depicted relative to the computer 1302 or portions thereof, can be stored in the remote memory/storage device 1352. It will be appreciated that the network connections shown are example and other means of establishing a communications link between the computers can be used.

When used in either a LAN or WAN networking environment, the computer 1302 can access cloud storage systems or other network-based storage systems in addition to, or in place of, external storage devices 1316 as described above, such as but not limited to a network virtual machine providing one or more aspects of storage or processing of information. Generally, a connection between the computer 1302 and a cloud storage system can be established over a LAN 1354 or WAN 1356 e.g., by the adapter 1358 or modem 1360, respectively. Upon connecting the computer 1302 to an associated cloud storage system, the external storage interface 1326 can, with the aid of the adapter 1358 and/or modem 1360, manage storage provided by the cloud storage system as it would other types of external storage. For instance, the external storage interface 1326 can be configured to provide access to cloud storage sources as if those sources were physically connected to the computer 1302.

The computer 1302 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability, multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a first qubit;
   a second qubit; and
   a multi-resonant architecture comprising a first resonator that capacitively couples the first qubit to the second qubit and a second resonator that capacitively couples the first qubit to the second qubit.

2. The device of claim 1, wherein the first qubit has a first operational frequency, wherein the second qubit has a second operational frequency, wherein the first resonator has a first resonant frequency that is less than the first operational frequency and the second operational frequency, and wherein the second resonator has a second resonant frequency that is greater than the first operational frequency and the second operational frequency.

3. The device of claim 2, wherein the first resonator and the second resonator are $\lambda/2$ resonators, and wherein the first resonator and the second resonator are in parallel.

4. The device of claim 3, wherein the first resonant frequency is about 3 gigahertz, wherein the second resonant frequency is about 6 gigahertz, and wherein the first operational frequency and the second operational frequency are between 4.5 gigahertz and 5.5 gigahertz.

5. The device of claim 2, wherein the first resonant frequency, the second resonant frequency, the first operational frequency, and the second operational frequency are fixed.

6. A device, comprising:
   a first qubit;
   a second qubit; and
   a multi-resonant architecture comprising a resonator, wherein a first end of the resonator is capacitively coupled to the first qubit and to the second qubit, and wherein a second end of the resonator is coupled to ground.

7. The device of claim 6, wherein the first qubit has a first operational frequency, wherein the second qubit has a second operational frequency, wherein the resonator has a first harmonic frequency that is less than the first operational frequency and the second operational frequency, and wherein the resonator has a second harmonic frequency that is greater than the first operational frequency and the second operational frequency.

8. The device of claim 7, wherein the resonator is a $\lambda/4$ resonator.

9. The device of claim 8, wherein the first harmonic frequency is about 2 gigahertz, wherein the second harmonic frequency is about 6 gigahertz, and wherein the first operational frequency and the second operational frequency are between 4.5 gigahertz and 5.5 gigahertz.

10. The device of claim 7, wherein the first harmonic frequency, the second harmonic frequency, the first operational frequency, and the second operational frequency are fixed.

11. A device, comprising:
    a first qubit;
    a second qubit; and
    a multi-resonant architecture comprising a resonator that capacitively couples the first qubit to the second qubit and a differential direct coupler that capacitively couples the first qubit to the second qubit, wherein the differential direct coupler capacitively couples opposite pads of the first qubit and the second qubit.

12. The device of claim 11, wherein the first qubit has a first operational frequency, wherein the second qubit has a second operational frequency, and wherein the resonator has a resonant frequency that is greater than the first operational frequency and the second operational frequency.

13. The device of claim 12, wherein the resonator is a $\lambda/2$ resonator, and wherein the resonator and the differential direct coupler are in parallel.

14. The device of claim 13, wherein the resonant frequency is about 6 gigahertz, and wherein the first operational frequency and the second operational frequency are between 4.5 gigahertz and 5.5 gigahertz.

15. The device of claim 12, wherein the resonant frequency, the first operational frequency, and the second operational frequency are fixed.

16. A device, comprising:
    a first qubit;
    a second qubit; and
    a multi-resonant architecture comprising a resonator and a direct coupler, wherein a first end of the resonator is capacitively coupled to the first qubit and to the second qubit, wherein a second end of the resonator is coupled to ground, wherein the direct coupler capacitively couples the first qubit to the second qubit, and wherein the direct coupler capacitively couples common pads of the first qubit and the second qubit.

17. The device of claim 16, wherein the first qubit has a first operational frequency, wherein the second qubit has a second operational frequency, and wherein the resonator has a resonant frequency that is greater than the first operational frequency and the second operational frequency.

18. The device of claim 17, wherein the resonator is a $\lambda/4$ resonator.

19. The device of claim 18, wherein the resonant frequency is about 6 gigahertz, and wherein the first operational frequency and the second operational frequency are between 4.5 gigahertz and 5.5 gigahertz.

20. The device of claim 17, wherein the resonant frequency, the first operational frequency, and the second operational frequency are fixed.

21. An apparatus, comprising:
    a first transmon qubit having a first operational frequency;
    a second transmon qubit having a second operational frequency; and a multi-resonant architecture that capacitively couples the first transmon qubit to the second transmon qubit, wherein the multi-resonant architecture has a first resonant frequency less than the first operational frequency and the second operational frequency and has a second resonant frequency greater than the first operational frequency and the second operational frequency.

22. The apparatus of claim 21, wherein the multi-resonant architecture comprises a first $\lambda/2$ resonator capacitively coupled to the first transmon qubit and to the second transmon qubit and comprises a second $\lambda/2$ resonator capacitively coupled to the first transmon qubit and to the second transmon qubit, wherein the first $\lambda/2$ resonator and the second $\lambda/2$ resonator are in parallel, wherein the first $\lambda/2$ resonator exhibits the first resonant frequency, and wherein the second $\lambda/2$ resonator exhibits the second resonant frequency.

23. The apparatus of claim 22, wherein the first resonant frequency is about 3 gigahertz, and wherein the second resonant frequency is about 6 gigahertz.

24. The apparatus of claim 21, wherein the multi-resonant architecture comprises a $\lambda/4$ resonator, wherein a first end of the $\lambda/4$ resonator is coupled between coupling capacitors of the first transmon qubit and the second transmon qubit, wherein a second end of the $\lambda/4$ resonator is shorted to ground, wherein a first harmonic of the $\lambda/4$ resonator is the first resonant frequency, and wherein a second harmonic of the $\lambda/4$ resonator is the second resonant frequency.

25. The apparatus of claim 24, wherein the first harmonic is about 2 gigahertz, and wherein the second harmonic is about 6 gigahertz.

* * * * *